United States Patent
Wang et al.

(10) Patent No.: US 10,756,266 B2
(45) Date of Patent: Aug. 25, 2020

(54) RESISTIVE RANDOM-ACCESS MEMORY WITH PROTECTED SWITCHING LAYER

(71) Applicant: W&Wram Devices, Inc., Palo Alto, CA (US)

(72) Inventors: Shih-Yuan Wang, Palo Alto, CA (US); Shih-Ping Wang, Palo Alto, CA (US)

(73) Assignee: WWRAM DEVICES, INC., Los Altos, CA (US)

( * ) Notice: Subject to any disclaimer, the term of this patent is extended or adjusted under 35 U.S.C. 154(b) by 0 days.

(21) Appl. No.: 16/537,062

(22) Filed: Aug. 9, 2019

(65) Prior Publication Data
US 2020/0006650 A1   Jan. 2, 2020

Related U.S. Application Data

(63) Continuation-in-part of application No. 16/062,414, filed as application No. PCT/US2016/066618 on Dec. 14, 2016, now Pat. No. 10,381,557.

(60) Provisional application No. 62/882,771, filed on Aug. 5, 2019, provisional application No. 62/882,604, filed on Aug. 4, 2019, provisional application No. 62/415,416, filed on Oct. 31, 2016, provisional application No. 62/393,571, filed on Sep. 12, 2016, provisional application No. 62/351,999, filed on Jun. 19, 2016, provisional application No. 62/351,952, filed on Jun. 18, 2016, provisional application No. 62/351,632, filed on Jun. 17, 2016, provisional application No. 62/266,947, filed on Dec. 14, 2015.

(51) Int. Cl.
H01L 45/00    (2006.01)

(52) U.S. Cl.
CPC ........ *H01L 45/085* (2013.01); *H01L 45/1233* (2013.01); *H01L 45/1266* (2013.01); *H01L 45/145* (2013.01); *H01L 45/165* (2013.01); *H01L 45/149* (2013.01)

(58) Field of Classification Search
CPC ... H01L 45/08; H01L 45/085; H01L 45/1266; H01L 45/1233
See application file for complete search history.

(56) References Cited

U.S. PATENT DOCUMENTS

| | | | |
|---|---|---|---|
| 8,735,863 B2 * | 5/2014 | Fowler | H01L 45/00 257/2 |
| 2006/0076566 A1 | 4/2006 | Ikeda et al. | |
| 2007/0173019 A1 | 7/2007 | Ho et al. | |
| 2011/0097825 A1 | 4/2011 | Cheng et al. | |
| 2015/0349251 A1 | 12/2015 | Chang et al. | |

(Continued)

FOREIGN PATENT DOCUMENTS

| WO | WO 2014/194069 | 12/2014 |
|---|---|---|
| WO | WO 2016/111724 | 7/2016 |

OTHER PUBLICATIONS

International Search Report dated Apr. 17, 2017 in connection with International application No. PCT/US16/66618.

(Continued)

*Primary Examiner* — Allison Bernstein
(74) *Attorney, Agent, or Firm* — Cooper & Dunham LLP

(57) ABSTRACT

Resistive RAM (RRAM) devices having increased reliability and related manufacturing methods are described. Greater reliability of RRAM cells over time can be achieved by avoiding direct contact of metal electrodes with the device switching layer.

20 Claims, 13 Drawing Sheets

(56) References Cited

U.S. PATENT DOCUMENTS

2015/0357566 A1 12/2015 Wang et al.
2017/0012083 A1 1/2017 Wang et al.
2017/0244028 A1 8/2017 Wang et al.

OTHER PUBLICATIONS

"FD-SOI", Soitec, https://www.soitec.com/en/products/fd-soi, Soitec Fully Depleted SOI (2016).

Dawson et al., "Nature of Cu Interstitials in AlO and the Implications for Filament Formation in Conductive Bridge Random Access Memory Devices", J. Phys. Chem. C, Just Accepted Manuscript, DOI: 10.1021/acs.jpcc.6b02728, Publication Date (Web): Jun. 13, 2016.

Gao et al, "The effect of Ti and O ion implantation on the resistive switching in Pt/TiO 2-x /Pt devices", Appl. Phys. A (2015) 120:1599-1603.

Gunawan et al., Optimal control of rapid thermal annealing in a semiconductor process, Journal of Process Control 14 (2004) 423-430.

He et al., "Metal-Dielectric Diffusion Processes: Fundamentals, chapter 2", Metal-Dielectric Interfaces in Gigascale Electronics, 11 Springer Series in Materials Science 157, DOI: 10.1007/978-1-4614-1812-2_2, Springer Science+Business Media, LLC 2012.

Kim et al., "Dopant concentration dependent resistive switching characteristics in Cu/SiNx/Si structure" Journal of Alloys and Compounds 686 (2016) 479-483.

Kim et al., "Forming-free resistive switching characteristics and improved reliability in sub-stoichiometric NbNx films", Phys. Status Solidi RRL 9, No. 4 (2015).

Kim et. al, A Functional Hybrid Crossbar-Array/CMOS Systems for Data Storage and Neuromorphic Applications, Nano Letters, pp. 389-395, Dec. 5, 2011.

Kim et. al, Voltage divider effect for the improvement of variability and endurance of TaOx memristor devices, nature.com/scientific reports, pp. 1-6, Feb. 2, 2016.

Lasky, "Wafer bonding for silicon-on-insulator technologies", Applied Physics Letters 48, 78 (1986).

Li et. al, Three-dimension crossbar arrays of self-rectifying Si/SiO2/Si memristors, Nature communications, pp. 1-7, Jun. 5, 2017.

Magyari-Köpe et al., Doping Technology for RRAM—Opportunities and Challenges, (2016) IEEE.

Strachan et al., "The switching location of a bipolar memristor: chemical, thermal and structural mapping", Nanotechnology 22 (2011) 254015 (6pp).

Wong et al. "Metal-Oxide RRAM", vol. 100, No. 6, Jun. 2012 | Proceedings of the IEEE.

Yang et. al, High switching endurance in TAOx memristive devices, Applied Physics Letters 97, 232102 (2010).

Yang et. al, Memristive switching mechanism for metal/oxide/metal nanodevices, nature nanotechnology vol. 3, Jul. 2008.

* cited by examiner

RESISTIVE RANDOM-ACCESS MEMORY WITH PROTECTED SWITCHING LAYER

REFERENCE TO RELATED APPLICATIONS

This patent application is a continuation-in-part of U.S. application Ser. No. 16/062,414 filed Jun. 14, 2018, allowed on Apr. 22, 2019, and having expected U.S. Pat. No. 10,381,557, and said U.S. application Ser. No. 16/062,414 is a U.S. National Stage entry of International Patent Appl. No. PCT/US16/66618 filed on Dec. 14, 2016 and published as WO 2017/106317.

This application incorporates by reference and claims the benefit of the filing date of each of the above-identified applications, as well as of the applications that they incorporate by reference, directly or indirectly, and the benefit of which they claim, including U.S. provisional applications, U.S. non-provisional applications, and International applications.

This patent application claims the priority of and incorporates by reference each of the following provisional patent applications:

U.S. Prov. Ser. No. 62/882,771 filed Aug. 5, 2019; and
U.S. Prov. Ser. No. 62/882,604 filed Aug. 4, 2019.

Said International Patent Appl. No. PCT/US16/66618 claims the benefit of and incorporates by reference each of the following provisional patent applications:

U.S. Prov. Ser. No. 62/266,947 filed Dec. 14, 2015;
U.S. Prov. Ser. No. 62/351,632 filed Jun. 17, 2016;
U.S. Prov. Ser. No. 62/351,952 filed Jun. 18, 2016;
U.S. Prov. Ser. No. 62/351,999 filed Jun. 19, 2016;
U.S. Prov. Ser. No. 62/393,571 filed Sep. 12, 2016; and
U.S. Prov. Ser. No. 62/415,416 filed Oct. 31, 2016.

Additionally, this patent application is related to and incorporates by reference each of the following patents and patent applications:

U.S. Pat. No. 9,978,939 granted on May 22, 2018, having U.S. appl. Ser. No. 15/446,626 filed Mar. 1, 2017;
U.S. Pat. No. 9,647,036 granted on May 9, 2017, having U.S. appl. Ser. No. 15/010,450 filed Jan. 29, 2016;
U.S. Pat. No. 9,515,262 granted on Dec. 6, 2016 having U.S. application Ser. No. 14/829,327 filed Aug. 18, 2015;
International Patent Application Ser. No. PCT/US2015/45731 filed Nov. 25, 2015; and
International Patent Application Ser. No. PCT/US2014/039990 filed May 29, 2014.

FIELD

This patent specification generally relates mainly to resistive random-access memory devices. More particularly, some embodiments relate to all silicon resistive random-access memory having switching regions that do not contact metal electrodes.

BACKGROUND

Memristors or resistive random-access memory (RRAM) have been made with metal-metal oxide-metal structures where the metal oxide is a switching layer. For example, see reference: Kim et. al, Voltage divider effect for the improvement of variability and endurance of TaOx memristor devices, nature.com/scientific reports, 2 Feb. 2016 (incorporated herein by reference); Yang et. al, High switching endurance in TAOx memristive devices, Applied Physics Letters 97, 232102 (2010) (incorporated herein by reference); and Yang2 et. al, Memristive switching mechanism for metal/oxide/metal nanodevices, nature nanotechnology Vol 3, July 2008 (incorporated herein by reference). In configurations such as discussed in those references, for example, contamination is possible due to metal electrodes being in contact to the switching region. Such contamination can reduce the lifetime of the memristor device.

The subject matter claimed herein is not limited to embodiments that solve any specific disadvantages or that operate only in environments such as those described above. Rather, this background is only provided to illustrate one exemplary technology area where some embodiments described herein may be practiced.

SUMMARY

According to some embodiments, a resistive random-access memory (RRAM) device comprises: an intermediate first layer that includes a switching region with added switching species of at least one different material; a device layer of a semiconductor material at one side of the intermediate layer and includes a first doped region, and a substrate layer of a semiconductor material at an opposite side of the first layer and comprises a second doped region; and electrodes that are spaced from said switching region and contact said first and second doped regions; wherein said switching region is configured to switch between higher and lower resistivity states in response to a switching voltage without having been conditioned with a higher, breakdown voltage.

This RRAM device may include one or more of the following features: one or more active electronic circuits can be formed in one or both of said device and substrate layers; the one or more active electronic circuits can be formed only at said device layer or only at said substrate layer; at least one of the electrodes can have a contact that extends through said device layer and said intermediate layer to said second doped region but is spaced from said switching region; the intermediate layer and the device and substrate layers can comprise a single chip and the switching region and first and second doped regions can be configured as plural, individually addressed resistive memory elements; these resistive memory elements can be characterized by a lifetime of 100 million or more switching cycles and can be characterized by differences of less than 10 percent in their respective switching voltages; the electrodes can be configured to couple selected ones of said individually addressable resistive memory elements with respective ones of said one or more active electronic circuits; and the active electronic circuits can comprise at least one first circuit that is surrounded by said individually addressable resistive memory elements and can further comprise at least one second circuit that is not surrounded by said individually addressable resistive memory devices.

According to some embodiments, a resistive random-access memory (RRAM) device comprises: a first layer comprising a switching region with added switching species of at least one different material; a device layer of Si with a first doped region at one side of the switching region, and a substrate layer of Si with a second doped region at an opposite side of the switching region; and electrodes that are spaced from said switching region and contact said first and second doped regions; wherein said switching region is configured to switch between higher and lower resistivity states in response to a switching voltage absent prior conditioning with a higher, breakdown voltage.

The RRAM device described in the immediately preceding paragraph may further include one or more of the following features: the first layer can be a buried oxide layer (BOX) and the switching region can be a portion thereof that has said added switching species of at least one different material; the first and second doped regions can be offset relative to each other but with a portion of each being coextensive with said switching region; the electrodes can contact portions of said doped regions that are not coextensive with said switching region; the first layer and said device and substrate layers can be formed as a single chip and said switching region and first and second doped regions can be configured as plural, individually addressed resistive memory elements; at least one active electronic circuit can be formed in or on said single chip and can interact with said memory elements; the at least one active electronic circuit and said electrodes can be at the same side of said switching region or the at least one active electronic circuit and said electrodes can be at opposite sides of said switching region; and the at least one active electronic circuit can be or can include at least one active electronic circuit that is surrounded by said memory elements.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The drawings illustrating devices are not to scale and show in straight lines surfaces and interfaces that in actual devices would not be as linear or planar. The subject matter hereof will be described and explained with additional specificity and detail through the use of the accompanying drawings in which:

DETAILED DESCRIPTION

Figure 1A:
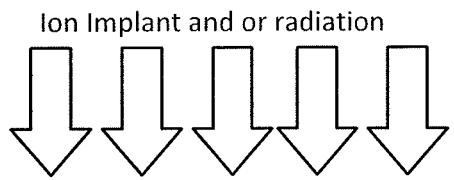
FIGS. 1A-1D are diagrams showing structures for use in manufacturing nonvolatile memory elements, the structures including an insulator $SiO_2$ clad above and below with Silicon, according to some embodiments.
Figure 1A:
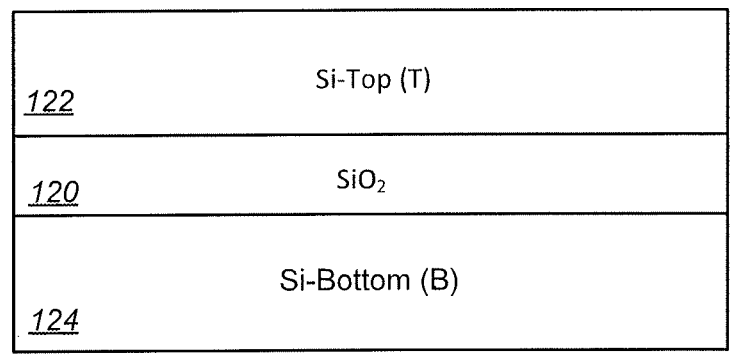

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

In known resistive random-access memory (RRAM or ReRAM), also known as "memristors," the RRAM are fabricated by depositing a switching layer that is sub-stoichiometric and/or non-stoichiometric and often with defects, and the switching layer is in direct contact with metal electrodes. Ions can be implanted into such switching layers. See, e.g., The effect of Ti and O ion implantation on the resistive switching in $Pt/TiO_{2-x}/Pt$ devices; Gao et al, Appl. Phys. A (2015) 120:1599-1603 (incorporated herein by reference), which discusses implanting Ti and O through the top Au/Pt electrode into a non-stoichiometric $TiO_{2-x}$ switching layer deposited by atomic layer deposition (ALD). Implanting Ti and O ions resulted in reduction or elimination of the forming voltage. However, starting with a non- or sub-stoichiometric switching layer having defects and introducing additional ions that may further change its stoichiometricity and an increase in defects due to ion implantation can result in non-reproducible resistive switching characteristics. Starting with a defective film and introducing more defects and uncertainties in the stoichiometricity of the switching layer can result in large variations in the RRAM characteristics and poor reproducibility. In addition, in such known RRAM the switching layer is in direct contact with metal such as Pt/Ti and thermal annealing is used to cause the Ti to diffuse into the switching layer. This results in further non-stoichiometricity and hard-to-control diffusion of Ti ions, which further adds uncertainties and non-reproducibility. The density of defects and ions and vacancies are unknown. This is similar to not knowing and/or not controlling the doping of a pn junctions with acceptors and donor atoms that can result in a non-reproducible transistor for example. *Improvement of Resistive Switching Properties in ZrO$_2$-Based ReRAM With Implanted Ti Ions*, Liu et al, IEEE ELECTRON DEVICE LETTERS, VOL. 30, NO. 12, DECEMBER 2009 (incorporated herein by reference) discusses a switching layer of ZrO$_2$ which is electron beam evaporated and subsequently thermally annealed resulting in a polycrystalline layer with defects and regions of non-stoichiometricity. In addition the ZrO$_x$ is deposited on metal which results in poor interface quality and uncontrolled metal ion diffusion into the switching layer resulting in defects and non-stoichiometric regions and unknown and/or uncontrollable doping of metal ions in the switching layer. Ti ions are then implanted into the ZrO$_x$ switching layer adding Ti ions, and defects. With so many uncontrollable and unknown variables such as density of metal ions, oxygen ions, vacancies, defects it is difficult to attain reproducibility, repeatability, device to device consistency of the switching parameters and reliability to CMOS manufacturing and performance standards. In *Application of ion-implantation for improved non-volatile resistive random access memory (ReRAM)*, Elliman et al, Nuclear Instruments and Methods in Physics Research B 307 (2013) 98-101 (incorporated herein by reference), oxygen is implanted into a stoichiometric Ta$_2$O$_5$ film to introduce extra O ions and vacancies for switching and the Ta$_2$O$_5$ transforms into a sub-stoichiometric layer TaO$_x$. Ta electrodes are used to contact the switching layer directly. The metal ions in the metal electrode can diffuse readily into the switching layer during growth of the switching layer and during device operation where voltage and electric current exist. Uncontrolled metal ions, defects and vacancy concentration can affect reproducibility, reliability and variability of the RRAM devices switching characteristics. Electric current during device operations can drive metal ions from the electrode that is in direct contact with the switching layer into the switching layer and can cause unknown and uncontrollable variation in density of the metal ions within the switching layer. Irreproducibility, poor reliability and variability can result both within a single device and from device to device.

It has been proposed in known technology that a sub-stoichiometric switching layer is needed for resistive switching and in particular for forming free resistive switching. See e.g., *Forming-free resistive switching characteristics and improved reliability in sub-stoichiometric NbN$_x$ films*, Kim et al, Phys. Status Solidi RRL 9, No. 4 (2015) (incorporated herein by reference). Ti and Pt/Ti electrodes are in direct contact with the NbN$_x$ switching layer, which can cause diffusion of metal ions into the switching layer causing poor reliability and non-reproducibility of the RRAM switching characteristics.

According to some embodiments of this disclosure, the starting switching layer is as stoichiometric and with as few defects as possible or at least practicable. It is desirable to have the switching layer be stoichiometric and crystalline or almost crystalline. In addition, the switching layer interface should not be to a metallic surface that can cause uncertainties of metal ion diffusing into the switching layer. Such diffusion can be difficult to control and reproduce on a manufacturing scale. Direct contact with metal surfaces by the switching layer interface can cause metal ion diffusion due to not only high temperature processing/fabrication but also during actual operation of the RRAM since local heating due to the product of current and voltage (joule heating) power dissipation can be as high if not higher than some processing temperatures. See, e.g., *The switching location of a bipolar memristor: chemical, thermal and structural mapping*, Strachan et al, Nanotechnology 22 (2011) 254015 (6pp) (incorporated herein by reference). Such diffusion of metal ions into the switching layer during actual device memory operations can cause additional defects. The migration of additional ions can eventually lead to device failure after many cycles of HRS-LRS-HRS (High Resistive State-Low Resistive State) memory operation of the RRAM device. The HRS/LRS ratio can diminish and eventually the device can be electrically shorted indicating excess conductive paths and/or excess conductivity which can be caused by excess metal ions, and/or excess defects that can provide current leakage paths. Direct contact of the switching layer with metal electrodes that can diffuse metal ions into the switching layer is not desirable. In contrast, diffusion barriers, interfaces where diffusion is slow, low diffusivity, difficult and/or minimal diffusion or drift of the metal ions into the switching layer, lead to higher reproducibility and reliability of the RRAM switching characteristics. Diffusion and drift are two methods by which metal ions can migrate into the switching layer, diffusion is temperature dependent and drift is electric field dependent. See, e.g., *Metal-Dielectric Diffusion Processes: Fundamentals*, chapter 2, He et al., Metal-Dielectric Interfaces in Gigascale Electronics, 11 Springer Series in Materials Science 157, DOI: 10.1007/978-1-4614-1812-2_2, Springer Science+Business Media, LLC 2012 (incorporated herein by reference).

Figure 1B:
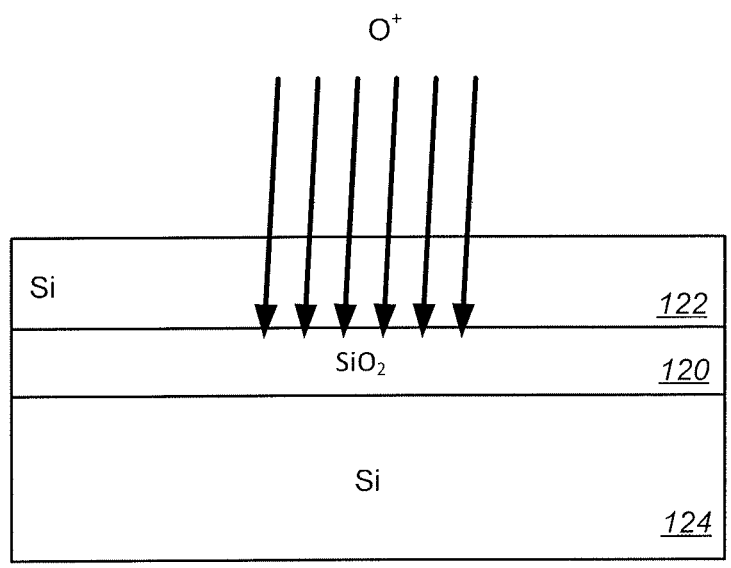
Figure 1C:
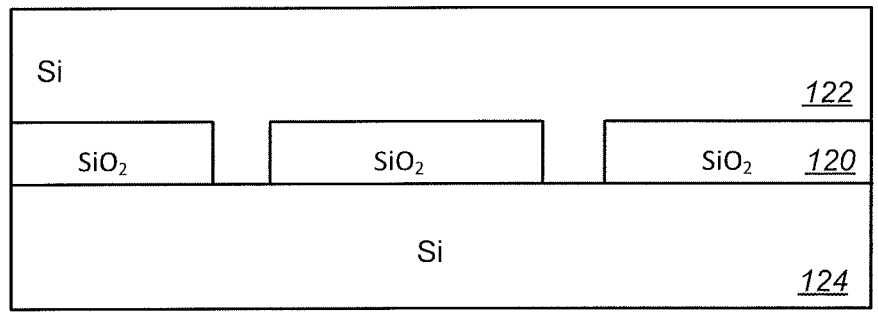

FIGS. 1A-1D are diagrams showing structures for use in manufacturing nonvolatile memory elements, the structures including an insulator SiO$_2$ clad above and below with Silicon, according to some embodiments. In FIG. 1A The SOI (Silicon On Insulator) or BOX (Buried OXide) structure includes an SiO$_2$ layer 120 clad both above and below with silicon layers 122 and 124. According to some embodiments, an oxygen ion implanted buried layer in Silicon can be annealed to form buried silicon dioxide layer 120 as is shown in FIG. 1B. According to some other embodiments, the upper Si layer 122 can be formed by epitaxial lateral overgrowth on the silicon dioxide layer 120 as shown in FIG. 1C. In this case both the top and bottom Si layers 122 and 124 are device quality and in some cases CMOS device quality. Other buried insulating layers such as silicon nitride, silicon carbide, are also possible instead of or in addition to SiO$_2$ layer 120. In the case of epitaxial overgrowth, other insulating layers such as tungsten oxide, tantalum oxide, titanium oxide, to name a few, can be grown stoichiometric and/or almost stoichiometric by methods such as atomic layer deposition for example. Metal ions for switching can also be introduced controllably during atomic layer deposition such that an accurate doping of the metal ions and/or oxygen ions can be grown into the switching layer accurately in both doping level and spatial distribution. Atomic layer deposition is one possible method of accurate growth, some other methods may include molecular beam epitaxy, plasma enhanced chemical vapor deposition, and laser ablation deposition. The buried insulating and/or switching layer can range in thickness from 1 nm to 100 nm (nanometers), and the silicon layer cladding the insulating layer can range in thicknesses from 2 nm to 1000 nm or more. The silicon layers 122 and 124 can be doped p and/or n type, and/or intrinsic or not intentionally doped. For example, the top Si layer 122 can be doped p type and the bottom Si layer 124 can be doped n type. In some cases the top Si 122 can be doped n type and the bottom Si 124 doped p type. In some other cases, both top and bottom Si are doped p or n of same or different doping level. In some further cases the top can be doped p or n and the bottom is intrinsic. In some further cases the bottom can be doped p or n and the top Si can be intrinsic. In some further cases both top and bottom Si layers are intrinsic. In some cases, both top and bottom can be doped n or doped p type. The p and n doping levels can range from $5\times10^{14}/cm^3$ to $5\times10^{21}/cm^3$ or more. In some cases, the Si layers can have both p and n doping to form a pn junction for example.

Other insulating layers can be used. In the case of $SiO_2$, it is desirable for the layer to be as stoichiometric as possible or practicable and as defect free as possible or practicable. In some cases the $SiO_2$ 120 is of CMOS quality and the silicon layers below and above the insulator are as defect free as reasonably possible and of CMOS quality. The $SiO_2$ layer 120 can be approximately 1-100 nm thick and the Si top of the insulator can be approximately 2-2000 nm thick.

Ion implantation and/or radiation is then performed on the $SiO_2$ layer 120 and necessarily passing through the top Si layer 122 and in some cases to the bottom Si layer 124, either locally where an implant mask can be used or globally. Implanted ions can be a combination, single and/or multiple different species of ions from the transition metal family, non-transition metal families and/or O, Ne, Ar, H, N, B, C, P. For example, Ti and/or O can be implanted partially into or through the $SiO_2$ layer where defects and ions controlled in both density and spatial distribution, e.g., Ti, Ta, Nb, O and/or N ions, can contribute to RRAM switching characteristic with high reproducibility and reliability and low variability in the RRAM switching parameters. Ion implantation and/or radiation together with or without rapid thermal annealing can be used to more precisely control the defect density and spatial distribution and thereby the switching parameters of the RRAM such as set and reset voltages, and preferably with low and/or no forming voltages.

Ion implantation of metal, oxygen, argon, and/or nitrogen can be used in conjunction with doping of the switching layers with metal ions and/or oxygen ions during growth such as by atomic layer deposition.

Figure 1D:
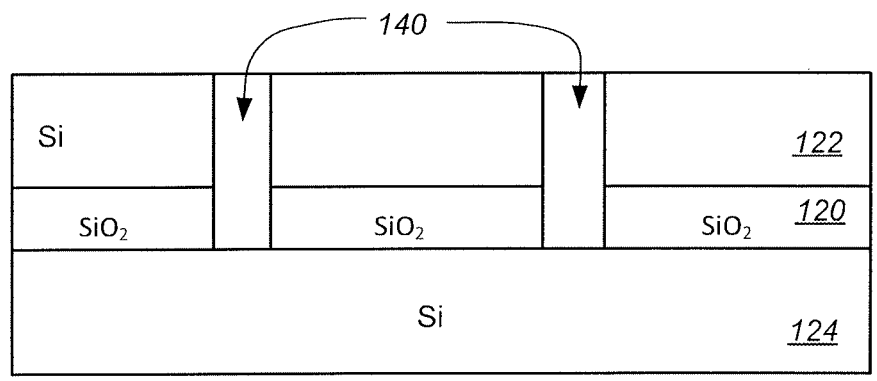

The techniques described herein when compared to known techniques with or without ion implantation differ by initially using a layer that a high quality defect free (or nearly defect free, such as is suitable for CMOS applications) that initially does not exhibit switching characteristics of multiple high resistance state (HRS) to low resistance state (LRS) cycles, and by using ion implantation and/or radiation to implant the switching ion(s) and controlled damages that can result in a reproducible, reliable switching characteristics of a RRAM device with low variability in its switching parameters. In addition, metal ions, oxygen and/or nitrogen can be incorporated during growth of the switching layer(s) when switching layers are fabricated by a growth method such as atomic layer deposition, and Si is epitaxially over grown on the switching layers. The switching layers can be isolated by a trench etch 140 and/or ion implantation as shown in FIG. 1D for example. Furthermore, metal electrodes are not in direct contact with the switching layer(s). In this example, Silicon 122 and 124 is in contact with $SiO_2$ layer 120 and the metal electrodes (see, e.g., FIG. 2) can be in contact with the Silicon 122 and 124.

One embodiment can be that the metal electrodes are not present during growth of $SiO_2$ layer on Si, ion implantation, or high temperature annealing or processing that could cause uncontrollable metal ion diffusion into the switching layer. The switching layer is the $SiO_2$ layer 120, with metal ions, O, N, H, B, C ions, inert ions such as Ne, Ar, Kr, Xe, and other ions in the periodic table that are implanted into and through the $SiO_2$ layer. For example, Ta ions and O ions can be implanted into and/or through the $SiO_2$ layer 120 to initiate resistive switching characteristics of a RRAM device with or without thermal annealing. Another example is Nb and N ions implanted into and through the $SiO_2$ layer 120 together with other ions such as Ar for example with or without post-implant thermal annealing.

According to some embodiments of this disclosure, the resistive switching (the terms switching and resistive switching are used herein interchangeably) layer is the initial $SiO_2$ layer 120 (or equivalent layer in nitride, carbide, hydride) bounded by Si 122 on the top and Si 124 on the bottom. The $SiO_2$ layer 120 also includes implanted ions such as transition metal ions, vacancies, oxygen and/or nitrogen to create regions in the $SiO_2$ and/or Si that are non- and/or stoichiometric. The $SiO_2$ layer 120 has controlled defects, ions, vacancies, densities and spatial distribution that can cause resistive switching. Si layer 122 and/or 124 can also be implanted as needed for tuning the stoichiometricity of the $SiO_2$ after and/or during the metal and o and/or N implant or for other reasons such as doping or creating PN junctions in one or both layers 122 and 124.

Figure 2:
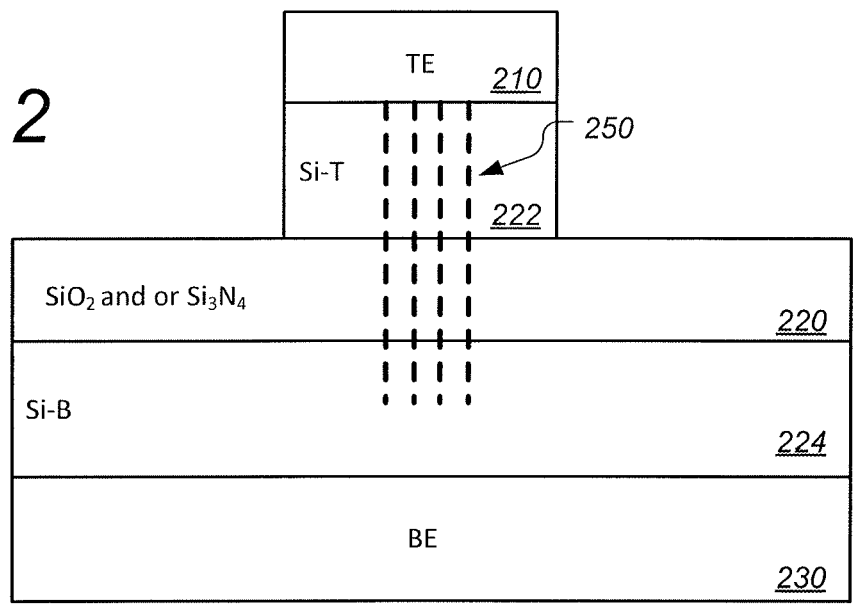
FIG. 2 is a schematic cross section of a nonvolatile memory element after ion implantation and/or irradiation showing possible regions with ions and/or defects, according to some embodiments.

In addition, the interfaces of the switching layer are with a non-metallic surface, in this example, a Si—$SiO_2$—Si interface such that metal ions from electrodes are kept a distance from the switching layer and therefore difficult to diffuse/migrate to the switching layer. An example of metal electrodes is shown in FIG. 2, where the electrodes are placed on the Si surface.

According to another embodiment of this disclosure, a high dielectric constant material such as $HfO_2$ is used as the initial switching layer and is bounded on both top and bottom interfaces by polysilicon, and/or amorphous silicon and/or crystalline silicon for example as part of the top and bottom electrodes. In some cases, the hafnium oxide can be "buried" using epitaxial lateral overgrowth as in FIG. 1C where the silicon dioxide in layer 120 can be replaced with hafnium oxide. After epitaxial lateral overgrowth, a chemical mechanical polishing step, commonly used in CMOS fabrication, can be used to polish the Si surface to the surface finish of CMOS fabrication processes specifications.

Ion implantation can be used to implant transition metal ions, O and/or N to cause the $HfO_2$ layer to be sub- or non-stoichiometric and result in oxidation-reduction type resistive switching due to formation of filaments, percolation paths, hopping, and other methods of charge transport. Metal electrodes are not in direct contact with the switching layer. Other oxides, nitrides, carbides and non-metal electrodes interfaces can be used. Metal electrode can be added at interfaces that are not the switching layer interface, for example, Si—Al can be added at the polysilicon interface.

Other switching layers and dopants are also possible. See, e.g.: *Doping Technology for RRAM—Opportunities and Challenges*, Magyari-Köpe et al., 978-1-4673-9478-9/16/ $31.00 ©2016 IEEE; *Dopant concentration dependent resistive switching characteristics in Cu/SiNx/Si structure*, Kim et al., Journal of Alloys and Compounds 686 (2016) 479-483 (referred to hereinafter as "Kim et al."); and *Nature of Cu Interstitials in AlO and the Implications for Filament Formation in Conductive Bridge Random Access Memory*

*Devices*, Dawson et al., *J. Phys. Chem. C*, Just Accepted Manuscript•DOI: 10.1021/acs.jpcc.6b02728•Publication Date (Web): 13 Jun. 2016 Downloaded from http://pubs.acs.org on Jun. 19, 2016 (referred to hereinafter as "Dawson et al."), all three of which are incorporated herein by reference. Examples of Metal-oxide RRAMs are given in *Metal-Oxide RRAM*, Wong et al., Vol. 100, No. 6, June 2012|Proceedings of the IEEE (incorporated herein by reference). In known techniques, a metal electrode and/or metal containing alloy electrode such as TiN is in direct contact with the switching layer. This is in contrast with embodiments of the present disclosure wherein the layers cladding the switching layer are not initially formed of either a metal or a metal-containing alloy. However, metal ions may be implanted into the cladding layers in addition to the switching layer after forming the cladding and switching layers. In addition, metal ions such as transition metals and post-transition metals in the switching layer deposited during growth for example may diffuse into the cladding layers that did not initially contain the metal ions intentionally. In addition, the cladding layers can be doped with acceptors and/or donors such as B, P and As to create p and n type semiconductors and/or pn junctions on the top and/or bottom Si cladding layer(s).

FIG. 2 is a schematic cross section of a nonvolatile memory element after ion implantation and/or irradiation showing possible regions with ions and/or defects, according to some embodiments. Rapid thermal annealing in Ar for example can be used to remove some of the defects to more precisely control the RRAM switching parameters. Other annealing techniques such as laser annealing can be used for more localized anneal for example. The Si layer 222 on top of $SiO_2$ or any other electrically insulating layer 220, labeled Si-Top (T) can also include a pn junction to provide a diode characteristic in the IV (current voltage) in order to reduce or minimize sneak current. Using standard photolithographic methods, the Si-Top (T) 222 can be patterned and a top electrode TE 210, ohmic and/or non-ohmic, can be deposited on the Si-Top (T) 222 preferably after ion implantation and in some cases before ion implantation. The top and/or bottom electrodes 210 and 230 can be metal, silicide such as PtSi, AlSi, TaSi, WSi, for example, and/or conductive nitride such as TiN and/or conductive oxide such as indium tin oxide. The substrate, which in this example is the bottom silicon labeled Si-Bottom(B) 224, can be chemically mechanically polished (CMP), patterned and metalized into a crossbar structure. Intermediate steps such as bonding the RRAM wafer to a sacrificial wafer for CMP processing and transferring the RRAM crossbar to an ASIC CMOS (application specific integrated circuit) wafer, and many other steps are omitted for simplicity as they can be similar to known IC processing. The dashed lines 250 represent defects caused by ion implantation and/or irradiation. The implant and/or irradiation for the structure shown in FIG. 2 can be selective or local such that only a specific region is implanted/irradiated as compared to blanket or global implant/irradiation. The localized implant/irradiation confines the switching away from the edge of the Si-Top (T) 222 where high electric field may exist and can cause reliability issues.

In this example, Si cladding layers doped either as n and/or p and/or pn are adjacent to the switching layer $SiO_2$ that was implanted with transition metal ions and/or O or N for example and with controlled defect density and spatial distribution with or without radiation and with or without thermal anneal. The interface between Si and the insulating $SiO_2$ layer is mostly lattice-matched and of CMOS quality and without metal in direct contact with the $SiO_2$ layer. Metal and/or silicide and/or TiN contacts are either Schottky or ohmic and contact the Si layers 222 and 224 as shown in FIG. 2 as TE 210 and BE 230. The electrodes can be Pt, W, Ta, Ti, Ni, Cu, Al, Cr, TiN, PtSi, AlSi, NiSi for example.

The metal ions taking part in the resistive switching mechanism are ion implanted and/or exist as part of the stoichiometric switching layer (for example $HfO_2$ switching layer, where the Hf may take part in the switching process in addition to implanted ions (that may also be Hf for example) and/or ions doped during switching layer growth process. Such metal ions have not diffused/drifted from metal and/or metal alloy electrodes in direct contact with the switching layer(s). This technique has been found to lead to greater reproducibility, repeatability and reliability of the RRAM devices.

Figure 3:
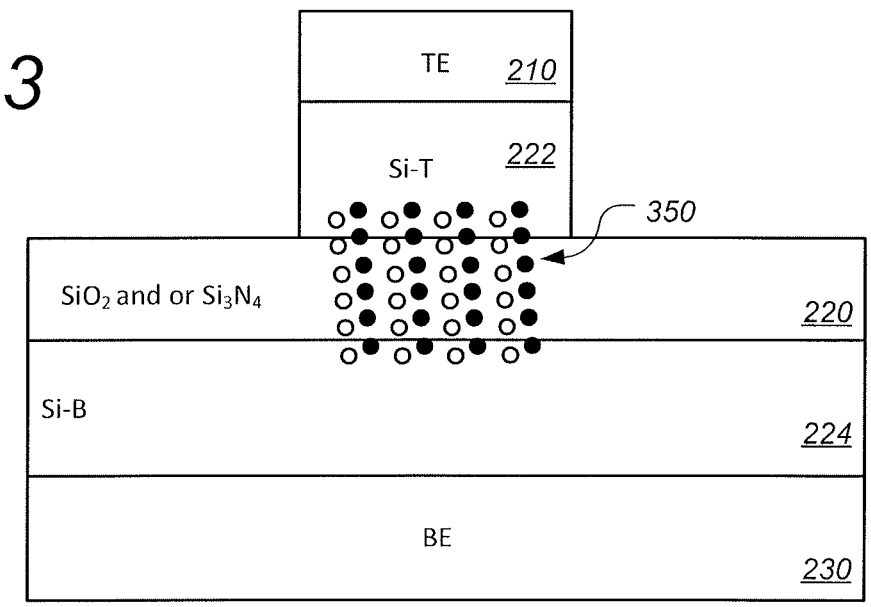
FIG. 3 is a schematic cross section of a nonvolatile memory element and illustrates implanted ions for switching, according to some embodiments.

FIG. 3 is a schematic cross section of a nonvolatile memory element and illustrates implanted ions for switching, according to some embodiments. The structure is as shown in FIG. 2, and the white and black circles 350 represent implanted ions, possibly of different types, for switching such as transition metals and oxygen and/or nitrogen for example. Damage from implanting of ions for switching such as transition metal ions such as Ti, Ta, W, Cr, Cu, Ni, Zn, Zr, Mn, Fe, V, Hf, Nb, Mo, non-transition metals such as Be, Mg, Ga, In, Bi, Se, Te, and/or non-metals such as O, N, H, C, F, Cl, Ne, Ar, Xe can be mostly annealed out using rapid thermal annealing. See e.g., *Optimal control of rapid thermal annealing in a semiconductor process*, Gunawan et al., Journal of Process Control 14 (2004) 423-430 (incorporated herein by reference). The residual damage if any, and/or the stress in the $SiO_2$ layer due to the addition of the ions with doping ranging from $10^{13}/cm^3$ to as high as mid $10^{22}/cm^3$ can be sufficient to result in forming free switching. Multiple energy ion implantation can be used if desired to generate a distribution of ions and/or multiple types of ions for better or optimal switching. In one embodiment, the distribution is mostly uniform for example Hf and O ions, Ti and O ions, Ta and O ions or Nb and N ions. In another embodiment, the O and/or N ions and the transition metal ions for example can be spatially separated with some overlap. This controlled introduction of switching ions and the purity of the process and/or using CMOS grade oxide layer as the switching layer matrix can result in high reproducibility and reliability of the RRAM memory system.

In some cases, the implanted ions are confined predominately in the switching layer 220 and in some cases predominately outside the switching layer 220, and in some cases, can penetrate and/or straggle into the Si cladding layer(s) 222 and 224. In some cases implanted ions can be in both the switching layers 220 and one or both of the silicon cladding layers 222 and 224. In some cases, the damage due to ion implant and/or radiation can exist in the switching layer 220 and/or one or both silicon cladding layer(s) 222 and 224. The damage from the ion implantation and/or radiation can be partially annealed out and/or fully annealed out to improve switching performance.

Impurities can be introduced into the $SiO_2$ layer or other oxide layers or nitride layers during the fabrication of the buried oxide layer by implantation and/or other deposition methods such as atomic layer deposition where the switching ions of metal and/or oxygen and/or nitrogen are introduced as dopants during growth of the switching layer for example. In certain cases, ion implantation and or radiation may or may not be further necessary for reliable and reproducible switching where the switching layer can be stoichiometric and or non-stoichiometric.

In addition, the switching layer can be a gate oxide such as hafnium oxide in CMOS and the bottom electrode can be highly doped Si and the top electrode can be highly doped polysilicon and or amorphous silicon and/or crystalline silicon, similar to a CMOS transistor but without the source and drain. Ions can be implanted through the polysilicon and/or silicon, where it can be thinned, to provide switching behavior. The gate oxide can be stoichiometric oxide such as silicon dioxide, hafnium oxide, where the oxide in the case of Si can be grown thermally and/or by atomic layer deposition for example. Starting with stoichiometric and/or crystalline switching layer similar to CMOS gate oxides and/or buried oxide layers and then introducing precisely and with high purity the switching ions can give good resistive memory characteristics. Prior to the introduction of the ions, the switching layer will not exhibit resistive switching characteristics reliably and reproducibly and will need to first reach a breakdown voltage before exhibiting desirable switching characteristics and in many cases may not switch more than once for example from high resistive state to low resistive state and stay at low resistive state.

Figure 4:
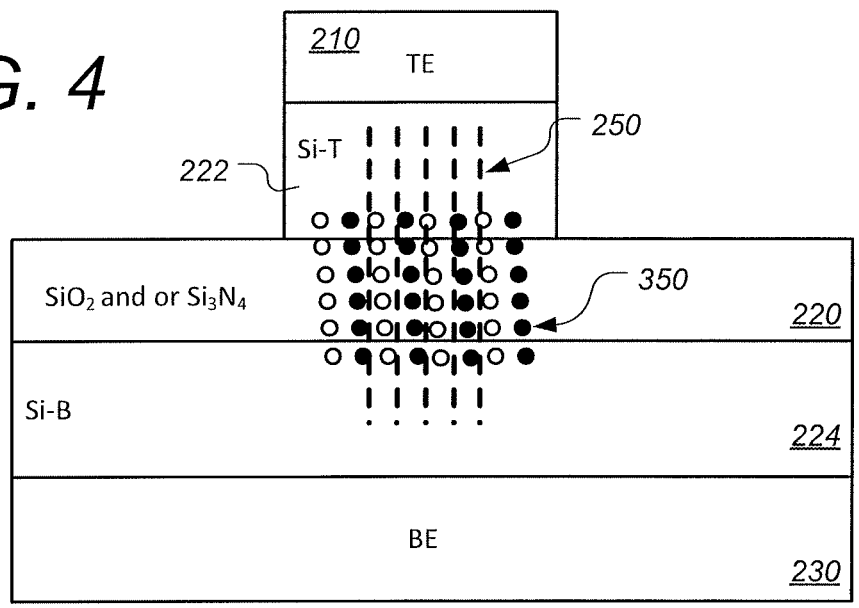
FIG. 4 is a schematic cross section of a nonvolatile memory element with switching ions and ions used to generate defects, according to some embodiments.

FIG. 4 is a schematic cross section of a nonvolatile memory element with switching ions and ions used to generate defects, according to some embodiments. The switching ions and ions used to generate defects can be implanted concurrently and/or sequentially where a thermal annealing such as rapid thermal annealing can be used between ion implantation processes. For example, thermal annealing can be used after the switching ion implant and the defect generating ions can be implanted after the thermal anneal and in some cases a thermal anneal may not be used at all. The switching layer 220, as shown in the FIG. 4, is between silicon layers 222 and 224 that can be doped n and/or p type and/or undoped. The silicon layer thickness can range from a few nanometers to hundreds of nanometers or more and in some cases from 1 nm to 2000 nm or more. Metal and/or conductive metal nitride TE 210 and BE 230 can be standard metal used in CMOS circuits such as aluminum and/or TiN for example and/or silicide and/or amorphous silicon that can be doped or undoped.

Figure 5:
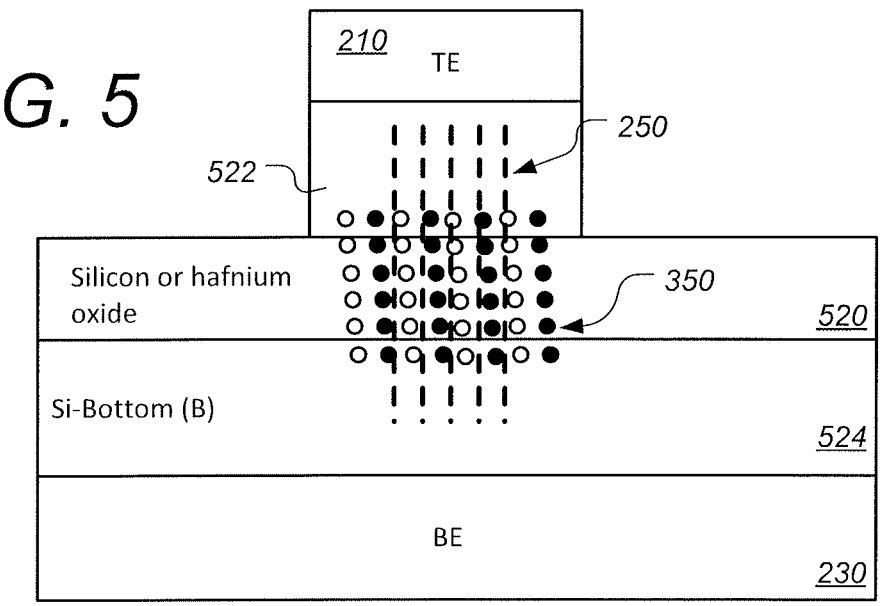
FIG. 5 is a schematic cross section of a nonvolatile memory element having a switching layer made of silicon oxide, hafnium oxide, silicon nitride, silicon carbide, titanium oxide, or tantalum oxide, according some embodiments.

FIG. 5 is a schematic cross section of a nonvolatile memory element having a switching layer 520 made of silicon oxide, hafnium oxide, silicon nitride, silicon carbide, titanium oxide, or tantalum oxide, according some embodiments. Layer 520 can be made of other material as well and is stoichiometric or almost stoichiometric. The switching layer 520 is between silicon layers 522 and 524 that can be crystalline, polycrystalline and/or amorphous Si and that can be doped n and/or p and/or undoped. The switching layer structure 520 can be deposited using techniques such as atomic layer deposition, plasma enhanced chemical vapor deposition, laser ablation deposition and/or molecular beam epitaxy, with thickness ranging from 0.1 to 100 nm or more. The switching layer 520 can be composed of multiple layers of dielectric material and each layer can have the same and/or different thicknesses. For example silicon oxide and hafnium oxide layers can be used for the switching layer 520. The switching ions 350 concentration can be controlled precisely by ion implantation and/or doping during switching layer growth which can be important for reproducibility and reliability. Doping during switching layer growth can result in a non-stoichiometric layer where the switching ions dope and disrupt the stoichiometricity of the switching layer. See, *Wafer bonding for silicon-on-insulator technologies*, Lasky, Applied Physics Letters 48, 78 (1986) (incorporated herein by reference). The Si can be wafer bonded to the switching layer(s) where a thin layer of $SiO_2$ can be used at the interface between the Si and the switching layer. The thin layer of $SiO_2$ can be doped with switching ions and/or non-switching ions. For example, the top layer is doped with Ti in $SiO_2$ and the bottom layer is not doped. In other examples both the top and bottom layers can be doped with switching and/or non-switching ions and/or extra oxygen ions for oxidation and reduction based switching mechanisms. Doping of switching ions can be uniform in the switching layer(s) and in some cases the ions are not uniformly distributed, in some cases the ions partially distributed within a switching layer(s), and in some cases the ions can have multiple distributions that can be uniform and/or not uniform and/or a combination thereof.

In addition, ion implantation as shown in FIG. 5 can be implemented to generate defects 250 in the crystalline and/or non-crystalline switching layer(s) to facilitate the formation of conductive channels due to species migration and mobility under electric and/or thermal gradient and/or other gradient such as stress such that a breakdown voltage can be omitted in the operation of the nonvolatile memory. The implant ions can be switching ions and/or non-switching ions such as Ar, N, H, C, Ne, Au, to name a few.

Switching ions are introduced into the switching layer by ion implantation (e.g. ions 350) and/or by doping during switching layer growth and not by diffusion of switching ions from electrode in direct contact with the switching layer as in known prior art.

Figure 6:
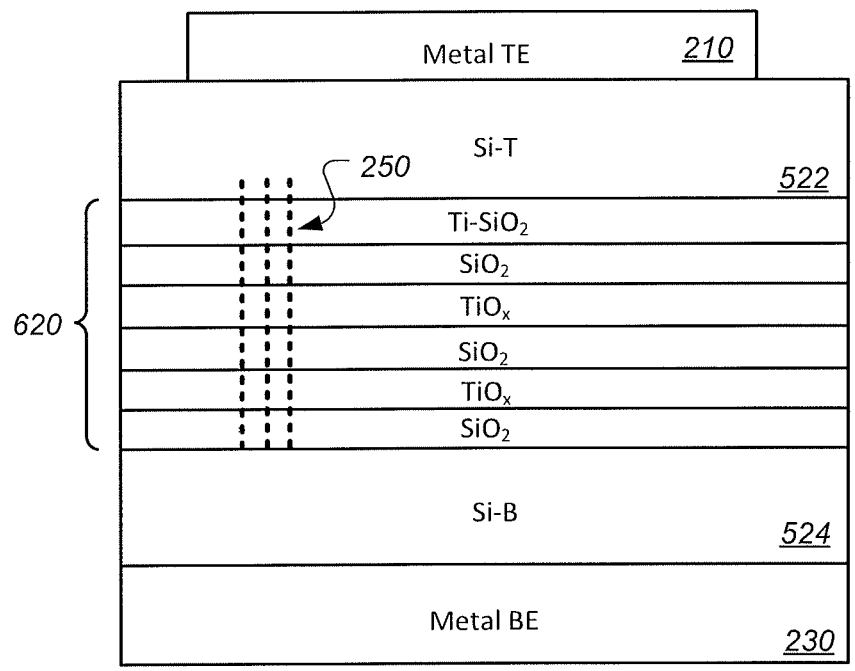
FIG. 6 is a schematic cross section of a nonvolatile memory element and illustrates switching layers having complex compositions, according to some embodiments.

FIG. 6 is a schematic cross section of a nonvolatile memory element and illustrates switching layers 620 having complex compositions, according to some embodiments. In switching layers 620, the switching ions are added precisely during growth such as with atomic layer deposition for example. The thickness of each layer ranges from 0.1 nm to 30 nm or more, where each of the layers can have a single thickness and/or multiple thicknesses. Single and/or multiple types of ions as either dopant and/or composition can be included with each layer. For example the top layer can be Hf oxide and Ti Oxide and silicon dioxide, another layer can be vanadium oxide and titanium oxide, other layers can be silicon dioxide and/or titanium oxide, and the bottom layer can be silicon dioxide doped with hafnium ions. There can be single and/or multiple layers 620. These layers are sandwiched by silicon 522 and 524 that can be crystalline and/or non-crystalline and formed using wafer bonding for example, or similar to the formation of SOI process or epitaxial lateral overgrowth as in FIG. 1C where Si and the oxide layer can form a bond through silicon dioxide at the interface with the oxide layer which in some cases can be a silicon dioxide layer as a part of the switching layer(s).

Ion implantation can be used to generate defects 250 with switching and/or non-switching ions, and the implant depth can be into the switching layers, partially into the switching layers and/or through the switching layers and/or partially into the bottom Si layer. Ion implantation can be conducted prior to wafer bonding and/or after wafer bonding and implanted through thinned top silicon material. Metal and/or silicide can then be used on the silicon to form electrodes to reduce resistivity of the electrically conduction paths to each nonvolatile memory element.

Figure 7:
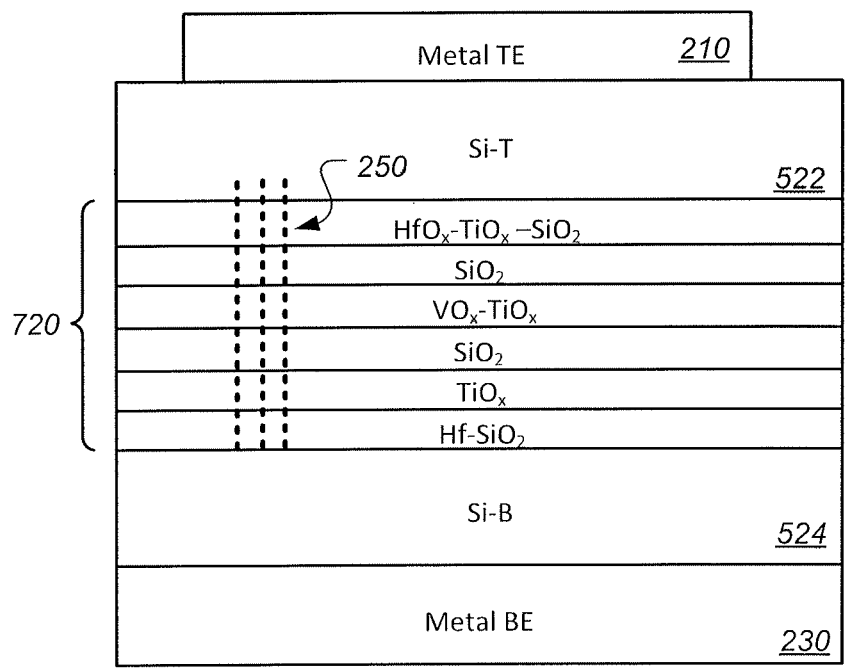
FIG. 7 is a schematic cross section of a nonvolatile memory element and illustrates further aspects of switching layer compositions, according to some embodiments.

FIG. 7 is a schematic cross section of a nonvolatile memory element and illustrates further aspects of switching layer compositions, according to some embodiments. As in FIG. 6, switching layer(s) 720 can have different composition and/or doping of switching and/or non-switching ions. The layers 720 can be grown by atomic layer deposition for example with precise control of the introduction of species density and spatial distribution. The layers 720 are sandwiched between silicon material 522 and 524 that can be doped p and/or n and/or undoped intrinsic and can be crystalline and/or non-crystalline. Electrodes of material such as Al and/or silicide for example, similar to electrode material in CMOS process, are used to reduce resistivity of the electrodes leading to each nonvolatile memory element in this case. A resistive random-access memory element also is called a memristor. Thicknesses of silicon and switching layers are as described supra. In the example of layer 720, hafnium ions and oxide of hafnium are the switching species together with oxygen. As shown, Hf ions are doped into the silicon dioxide layer(s) along with HfOx and Ox ions into various layer(s). Only a few example layers are shown. Variations of Hf, HfOx, Ox, silicon dioxide can be used and HfOx can be stoichiometric and/or non-stoichiometric and oxygen can be an ion, and/or ionized, and/or neutral. Ion implantation can be used to create defects before or after wafer bonding with switching and/or non-switching ions, and/or oxygen ions to create defects and to dope the switching layers with switching and/or non-switching ions (ions that contribute to switching such as transition metals and non-switching ions are for creation of damage/vacancies only such as Ar, He, Xe to name a few).

Other deposition methods can be used such as plasma enhanced chemical vapor deposition, chemical vapor deposition, laser ablation deposition, to name a few.

Figure 8:
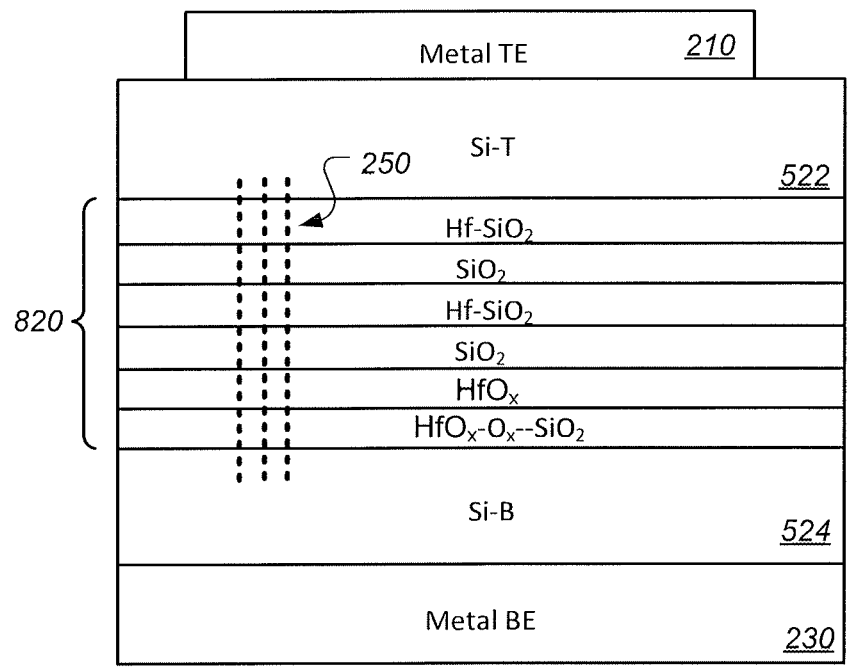
FIG. 8 is a schematic cross section of a nonvolatile memory element and illustrates further aspects of switching layer compositions, according to some embodiments.

FIG. 8 is a schematic cross section of a nonvolatile memory element and illustrates further aspects of switching layer compositions, according to some embodiments. The nonvolatile memory element has switching layer(s) 820 that can have different composition and/or doping of switching and/or non-switching ions. Switching ions are ions that participate in the resistive memory process, such as metal ions and oxygen, nitrogen, hydrogen ions, and in addition can also generate damage and vacancies. Non-switching ions are ions that don't participate directly in the memory process and are used for creating damage and vacancies, such as Ar, He, Xe, and other ions that do not participate in the oxidation-reduction processes of a resistive memory and/or radiation of high energy photons for example. The layers 820 can be grown by atomic layer deposition for example with precise control of the introduction of species. The layers 820 are sandwiched between silicon material 522 and 524 that can be doped p and/or n and/or undoped and can be crystalline and/or non-crystalline. Electrode materials such as Al and/or silicide for example, similar to electrode material in CMOS process, are used to reduce resistivity of the electrodes 210 and 230 leading to each nonvolatile memory element in this case. Thicknesses of silicon and switching layers can be as described, supra. In this example, hafnium ions and oxide of hafnium are the switching species together with oxygen. As shown, Hf ions are doped into the silicon dioxide layer(s) along with HfOx and Ox ions into various layer(s). Only a few example layers are shown; variations of Hf, HfOx, Ox, silicon dioxide can be used and where HfOx can be stoichiometric and/or non-stoichiometric and oxygen can be an ion, and/or ionized, and/or neutral. Ion implantation can be used to create defects before or after wafer bonding with switching, and/or non-switching ions, and/or oxygen ions to create defects.

Other deposition methods can be used such as plasma enhanced chemical vapor deposition, chemical vapor deposition, laser ablation deposition, to name a few.

Figure 9:
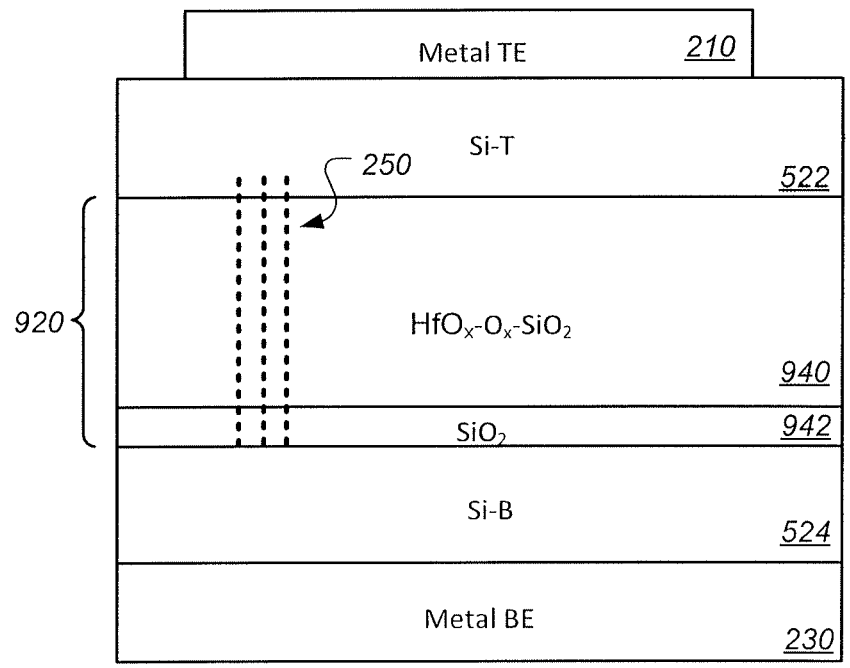
FIG. 9 is a schematic cross section of a nonvolatile memory element having a silicon dioxide switching layer doped with Hf and 0, according to some embodiments.

FIG. 9 is a schematic cross section of a nonvolatile memory element having a silicon dioxide switching layers 920 doped with Hf and O, according to some embodiments. In this example the switching layers 920 include a layer 940 that is doped precisely with Hf and O in a silicon dioxide layer using atomic layer deposition for example. The layers 920 are sandwiched between silicon material 522 and 524 that can be doped n and/or p and/or undoped and have metal and/or silicide electrodes in contact with the silicon. Ion implantation can be used to generate defects to facilitate the formation of conductive channels. A tunnel $SiO_2$ layer 942 can be included or not included. When the conductive filaments approach and come to contact the silicon material, a rectifying junction can be formed which is beneficial to reduce the sneak current effect in a crossbar RRAM architecture. In addition, with the tunnel silicon dioxide layer 942, a similar rectifying junction can be formed with the conductive filament(s).

Ion implantation can be used to introduce dopants such as metal ions, O, N that can contribute to the switching phenomenon and can create damage and vacancies and also ions such as Ar, He, Xe, that are used only to create damage and vacancies.

According to some embodiments of this disclosure, switching ions are introduced with precise doping density and spatial distribution, and the ions introduced this way, by growth and/or by ion implantation, participate in the switching phenomenon.

In two known structures Cu is deposited on a host material that may not participate directly in the switching process and is a conduit for the formation of metal ion bridges in a Conductive Bridge Random Access Memory or a Conductive Bridge Resistive Random Access Memory (CBRAM or CBRRAM). Dawson et al. and Ref. Kim et al. discuss dopant concentration dependent resistive switching characteristics in a Cu/SiNx/Si structure, where in both cases, metal such as Cu is in direct contact with the SiN or AlO switching host or layer. The switching layer or host may or may not participate in the switching process. The switching layer may contribute an O ion or vacancy and in some cases the switching host or layer may not participate and is simply a matrix to hold the switching species. Note that as used herein, the term switching layer includes, but is not limited to, host structures or host layers having bulk materials that do not directly participate in switching but rather host filaments, other structures or other materials that do participate in switching.

According to some embodiments of the present disclosure, metal electrode(s) are not in direct contact with either the switching layers and/or the host material (such as the SiN, AlO, $SiO_2$, to name a few). This is in contrast with known techniques where at least one metal or metal alloy such as TiN is in contact with the switching layer and/or host material.

Figure 10:
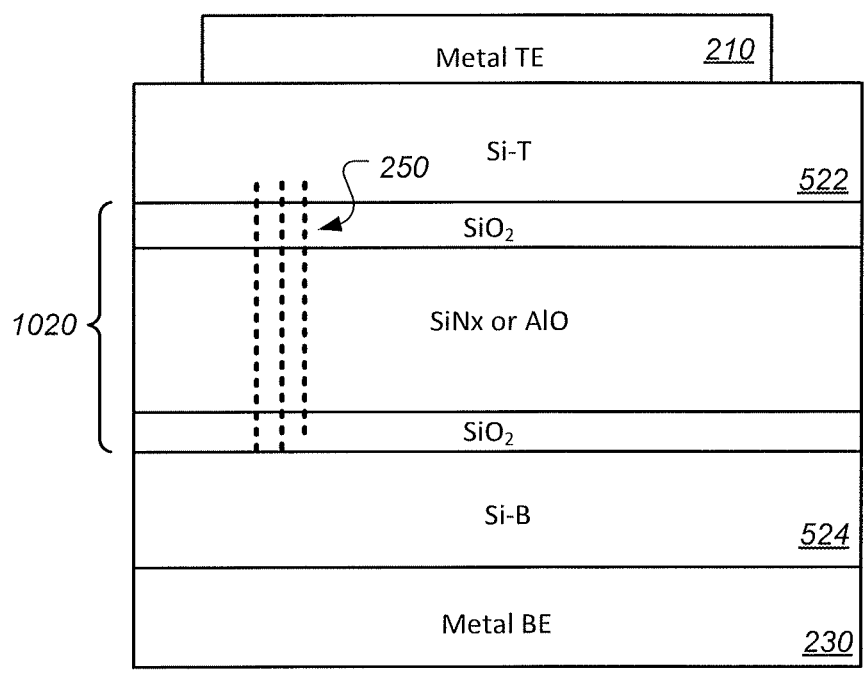
FIG. 10 is a schematic cross section of a CBRRAM or CBRAM structure where no metal electrodes are in direct contact with the host material, according to some embodiments.

FIG. 10 is a schematic cross section of a CBRRAM or CBRAM structure where no metal electrodes are in direct contact with the host material, according to some embodiments. The host material 1020 can be SiN, AlO and/or $SiO_2$ and/or combination thereof and can also include other materials such as diamond, carbide, SiN. In the case of oxidation reduction switching layers of TiO, HfO, WO, NbO, VO, TaO, the metal electrodes are not in direct contact with the switching layers or host. If metal electrodes were to be in direct contact with the switching layers and/or host layers, an uncontrollable density and number of ions would be available to participate in the switching process as the metal electrode can provide an "infinite" source of switching ions/species. This could eventually lead to failure of the nonvolatile memory device and/or result in non-reproducible switching characteristics.

According to some embodiments of the present disclosure, the metal electrode(s) do not contribute to the switching process since they are not in direct contact with the switching and/or host layer(s) which can be silicon dioxide, aluminum oxide, titanium oxide, tantalum oxide, hafnium oxide, vanadium oxide, tungsten oxide, molybdenum oxide, niobium oxide, chromium oxide, nickel oxide, transition metal oxides, silicon nitride, niobium nitride, tungsten nitride, gallium nitride, aluminum nitride, all metal nitrides, silicon carbide, hafnium carbide, magnesium carbide transititon metal carbide, metal carbides. The switching layer(s) and/or host layer(s) such as 1020 are sandwiched between layers 522 and 524 of Si and or other semiconducting material such as Ge, SiGe, GaAs, GaN, AlN, InP, InN, AlGaN, III-V material family to name a few, to keep away from the switching or host layer(s) metal ions from electrodes, which can be Al, Silicides such as aluminum silicide, platinum silicide, nickel silicide, titanium silicide, magnesium silicide, tungsten silicide, molybdenum silicide, platinum, titanium, tungsten, tantalum, copper, and other metals, 210 and 230 that might contribute to the switching process if one or both of those electrodes were to be in direct contact to the switching and/or host layer(s) 920. According to some embodiments, an Al electrode is deposited on the surface of the silicon opposite to the surface that is in contact to the switching and/or host layer(s). Other metal electrodes can also be used in this case, for example, Pt, Cu, Ti, Ag, Ni, to name a few.

As shown in FIG. 10, switching ions can be incorporated by doping methods such as during AlO and/or SiN growth. Cu and/or Ag can be incorporated in the growth process for example during ALD, PECVD, CVD to name a few. Such ions can also be incorporated by ion implantation of Cu and Ag for example. In addition, ion implantation of ions such as Ar, N, H, O, Ne, Au, Pt, to name a few, can be used to generate defects to create channels for the formation of the filaments. Thermal annealing may be used at any stage of the process to improve device switching characteristics. Ion implantation can be implemented before the SOI process and/or after the SOI process, and the depth of the ion implantation can be through the switching/host layer(s) 1020 and/or partially through the switching/host layer(s) 1020, and/or into the bottom cladding layers 524. Thin $SiO_2$ layer(s) can be used on one or on both the top and the bottom of the switching/host layer 1020, as illustrated in FIG. 10, to facilitate wafer bonding of the Si to the switching/host layer(s) 1020. Epitaxial lateral overgrowth of Si over the dielectric switching layers can also be used to bury the switching layer/host between Si cladding layers.

In certain cases, it is preferred that the metal electrodes are not in direct contact with the switching layers where migration of the metal ions into the switching layers can result in degradation of reliability and lifetime. In certain cases the switching ions are ion implanted, and/or deposited by other means such as co-deposition of the switching ions during deposition of the switching layer, doping of the switching layer with switching ions and vacancies, for example. Density of the switching ions can range from $1\times10^{16}/cm^3$ to $1\times10^{22}/cm^3$ or greater. Ions can include the metals, non-metals, the transition metals, post-transition metals, alkali earth metals, alkali metals, Lanthanide, and other non-metals such as fluorides, carbides, sulphides, in addition to oxygen, nitrogen, fluorine, chlorine, hydrogen, argon, xenon, and helium.

Other methods of fabricating a buried electrically insulating layer in silicon and/or silicon germanium alloy in addition to wafer bonding, epitaxial lateral overgrowth, selective area growth, can include nanostructures where thermal oxidation can fill a void and the thermally grown silicon dioxide can fill the void completely since $SiO_2$ occupies a larger volume than Si.

Figure 11A:
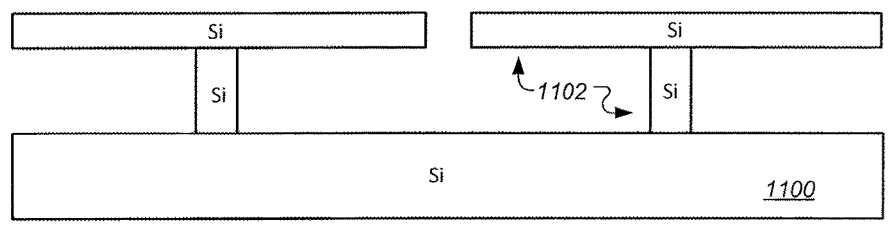
FIGS. 11A-11C and 12A-12B are cross section drawings illustrating aspects of manufacturing memory cells, according to some embodiments.
Figure 11B:
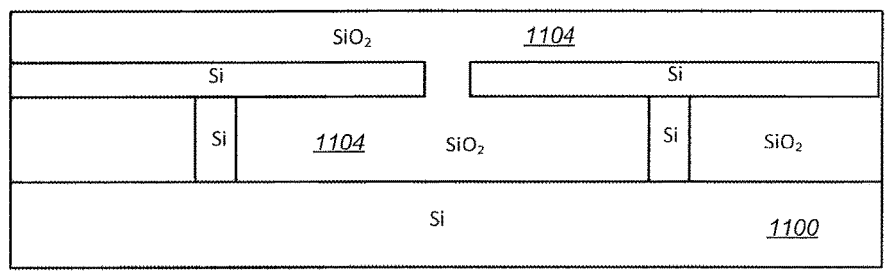
Figure 11C:
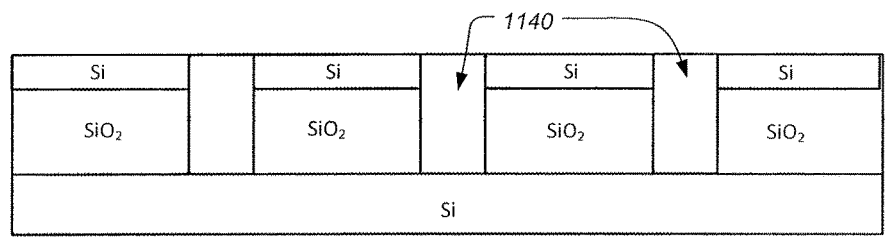

FIGS. 11A-11C and 12A-12B are cross section drawings illustrating aspects of manufacturing memory cells, according to some embodiments. In FIG. 11A, the nanostructures 1102 can be etched into Si 1100 and/or using Si epitaxial lateral overgrowth (ELOG) over a sacrificial dielectric layer 10 nm thick for example and then etching away the sacrificial dielectric layer leaving a 10 nm gap in height. The silicon 1100 can ben doped, p doped or undoped intrinsic. In FIG. 11B thermal oxide can be grown such that the voids between nanostructures 1102 are filled with silicon dioxide 1104 partially and/or completely as shown. FIG. 11C shows separation of the memory cells by a trench etch 1140. Planarization and/or polishing such as CMP can be used in the process to form the structure illustrated in FIG. 11C.

Figure 12A:
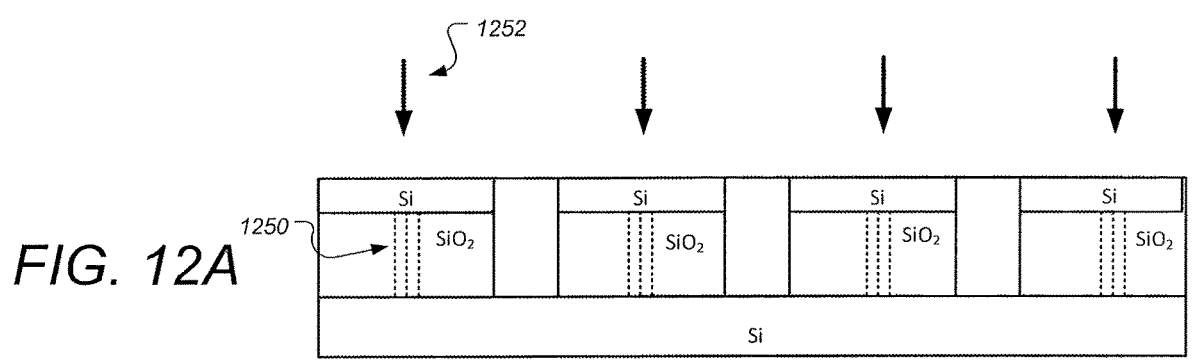
Figure 12B:
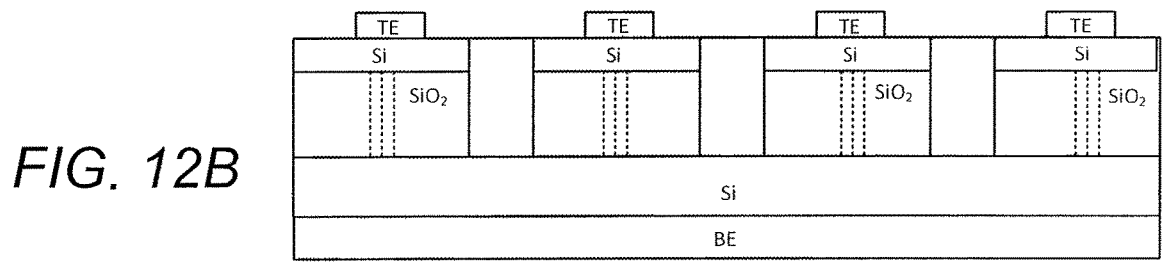

FIG. 12A illustrates ion implantation 1252 into the silicon dioxide with species that can cause damage 1250 for resistive switching and/or conductive bridging. The implant step of FIG. 12A can also be performed prior to isolation trenching as in FIG. 11C and can be a blanket ion implantation and/or localized ion implantation where an ion implantation mask is used such that areas to be implanted will not have the mask material. Following ion implant, optional thermal anneal can be performed before or after the deposition of top and bottom electrodes TE and BE shown in FIG. 12B. Not all steps for a compete RRAM device are shown for clarity. Only certain steps are shown to illustrate an example of a way of achieving a buried oxide with Si cladding. The thermal oxide thickness can range from 0.5 nm to 100 nm. Thermal oxide consumes approximately 45.5% silicon, so that a 10 nm silicon dioxide consumes about 4.55 nm silicon. Thus, in FIG. 11B a nanostructure with a gap of 10 nm can be thermally oxidized to fill the gap completely and/or partially with oxide growing from top and bottom simultaneously and consume approximately 2.27 nm of Si from each Si surface. The gap can range from 1 nm to 100 nm for example.

Ion implant of species ions can range in dose from $1\times10^6$ ions/cm$^2$ to $5\times10^{15}$ ions/cm$^2$ or higher, and in some cases to $5\times10^{17}$ ions/cm$^2$ or higher. Acceleration energies can range from less than 1 KeV to 400 KeV or more and the switching layer thickness can range from 1 nm to 100 nm or more. Ions can consist of the transition metals, post transition metals, H, N, O, He, Ar, Ne, Xe, Cl, S, F, to name a few. In addition, or instead, radiation can be used to generate defects and vacancies from gamma rays to x rays to UV for example.

In certain cases, where the switching layer is buried and cladded by silicon and or another semiconducting material such as Ge, SiGe, III-V material family, top and bottom (or left and right) and where the doping of ions is by methods such as atomic layer deposition for example, ion implantation and or radiation may or may not be further necessary for reproducible reliable RRAM operation.

In addition, other material such as SiGe, Ge, III-V family material such as GaAs, InP, GaN, to name a few can also be used in combination. Purity of the material can be critical for controlling the reproducibility and reliability of the resistive random-access memory. In some cases, the purity of the Si should be equivalent to the purity required for CMOS electronic device fabrication and processing, and in some cases the purity of the Si should be 99.9999999% pure or better, other than dopants such as donors and acceptors that are introduced intentionally for device operation. The purity standard applies to other materials used for the RRAM device. In a RRAM device, dopants, switching ions/species, vacancies/defect density are generated through ion implantation/radiation and/or epitaxial growth of CMOS standard in quality and purity and doping concentration.

For example there are approximately $5 \times 10^{22}$ Si atoms per $cm^3$ and if background impurities are less than $10^{15}/cm^3$, then the purity of the silicon is better than 0.9999999; in some cases the background impurities can be less than $10^{13}/cm^3$ and the purity of the silicon can be better than 0.999999999; in some cases the background impurity is less than $10^{12}/cm^3$ and the purity of the silicon can be better than 0.9999999999; and in some cases the background impurity is less than $2 \times 10^{10}/cm^3$ and the silicon purity can be approximately 0.999999999999 for example.

In known techniques, such control in purity and concentration in the switching layer is lacking and this causes poor reproducibility and reliability. To date, there is no known commercialization of a RRAM array on a high volume scale such as for flash memories for example.

The preferred material is Si and silicon dioxide, silicon nitride, silicon carbide, high dielectric gate materials such as hafnium oxide used in CMOS and combination thereof, and the RRAM array in 2D and/or 3D can be monolithically integrated with CMOS and/or BiCMOS electronics into a single chip. 3D refers here to stacking RRAM devices such as those illustrated in FIG. 1D or FIG. 10 for example, such that there are vertical stacks of respective RRAM elements.

In certain cases, metal ions from electrodes may migrate to the switching/host layer causing unintentional doping of metal ions into the switching layer. The density of such unintentionally migrating ions into the switching/host layer(s) should be less than $10^{22}/cm^3$ and in some cases less than $10^{20}/cm^3$ and in some cases less than $10^{18}/cm^3$ and in some cases less than $10^{16}/cm^3$ and in some cases less than $10^{14}/cm^3$ and in some cases less than $10^{13}/cm^3$. It is desirable that the unintentional ions are at least 10 times lower density than the intentional ions density, and in some cases 50 times lower and in some cases 100 times lower and in some cases 1000 times lower and in some cases more than 1000 times lower. There are cases where metal ions, O ions, vacancies, N ions, to name a few that are intentionally doped either by growth and or implantation into regions outside of the switching/host layer(s), from which they can migrate into the switching/host layer(s) to participate in the resistive switching process.

Reliability for the purposes of this patent specification means that RRAM devices have an expected lifetime of at least $10^8$ (one hundred million) cycles of switching when manufactured using current commercial manufacturing practices of companies such as one or more of Intel, Micron, and TSMC, and reproducibility means that RRAM devices can be manufactured using current commercial manufacturing practices of companies such as one or more of Intel, Micron, and TSMC with a yield of at least 90% in a run in which the individual elements of a RRAM device differ from each other in switching voltages when supplied to a customer or distributor by less than 10% and different RRAM devices of a manufacturing run differ from each other in switching voltages when supplied to a customer or distributor by less than 10%.

Purity standards of commercial CMOS for the purposes of this patent specification means the purity standards for relevant materials in CMOS devices currently supplied commercially on a large scale by companies such as one or more of Intel, Micron, and TSMC.

According to some embodiments, RRAM devices can be configured such that metal electrodes are not in contact with the switching layer. The RRAM devices cam be fabricated entirely using a partially or fully depleted Si device layer on a BOX layer on a Si substrate layer. Such Si device layer-BOX-Si substrates are used for state of the art CMOS ASICs. A prior reference discusses a Si—Si dioxide-Si memristor. See, Li et. al, Three-dimension crossbar arrays of self-rectifying $Si/SiO_2/Si$ memristors, Nature communications, 5 Jun. 2017 (incorporated herein by reference and hereinafter referred to as "Li et. al"). That reference discusses using a PN junction and the switching is caused by the rupture of the Si dioxide layer. An RRAM device with such a switching layer can have reduced lifetime. In contrast, according to some embodiments, an RRAM device includes a switching region that is ion implanted into the BOX layer to facilitate switching due to oxidation reduction of transition metal ions rather than by rupture or discharge.

Figure 13:
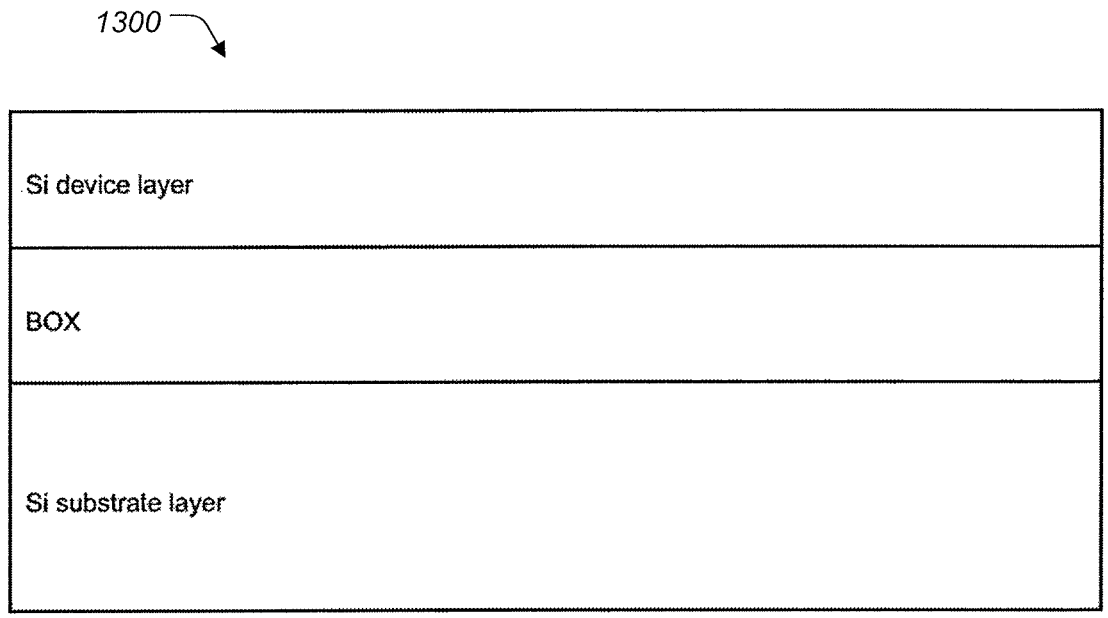
FIG. 13 shows a cross section schematic of a state-of-the-art CMOS wafer, according to some embodiments.

FIG. 13 shows a cross section schematic of a state-of-the-art CMOS wafer, according to some embodiments. The wafer 1300 consists of a Si substrate that can be intrinsic or low dope followed by a buried oxide layer (BOX) which is nominally stoichiometric Si dioxide followed by a Si device layer which can be intrinsic or low dope. The Si device layer can be partially or fully depleted and can have a thickness range from 5-20 nm, and in some cases 10-15 nm. The BOX layer can have a thickness ranging from 3-25 nm, and in some cases 15-25 nm. The Si substrate can have a thickness ranging from 650 microns or more, and in some cases the Si substrate can be thinned down to 5 microns, and in some cases to 3 microns or less. The Si substrate can be intrinsic or low dope. According to some embodiments, the silicon device layer and silicon substrate are all crystalline silicon. See, e.g. Ref. https://www.soitec.com/en/products/fd-soi, Soitec Fully Depleted SOI (silicon on insulator) wafers for high performance low power CMOS circuits applications.

Figure 14:
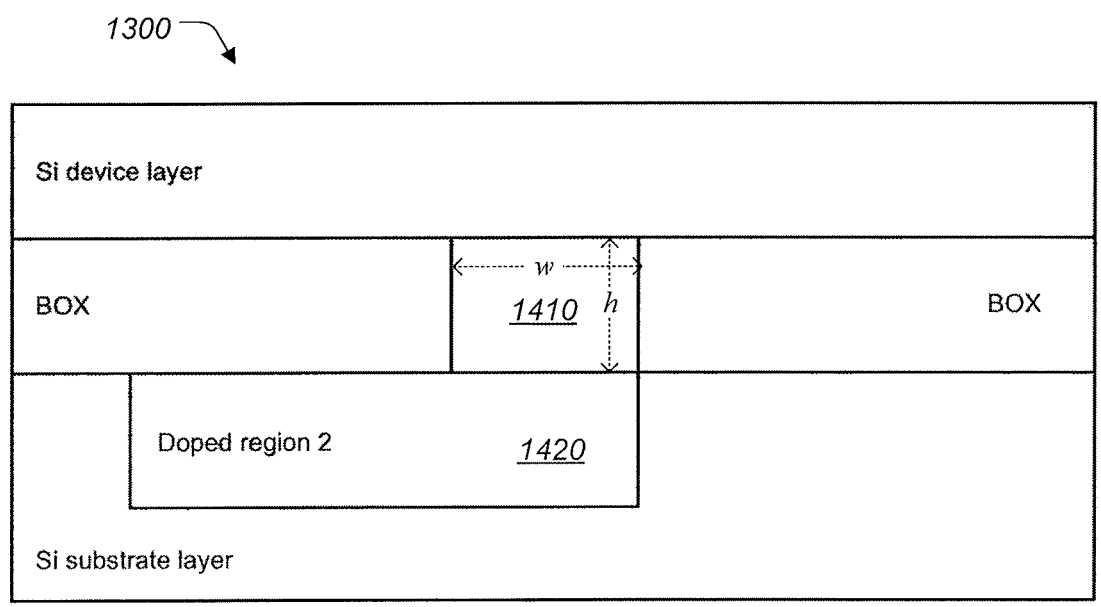
FIG. 14 shows a simple partial schematic cross section of a front end of line process, according to some embodiments.

FIG. 14 shows a simple partial schematic cross section of a front end of line process, according to some embodiments. On wafer 1300 a second doped region 1420 is formed in the Si substrate beneath the BOX layer. The second doped region 1420 can be N or P doping type and can have a doping concentration ranging from $10^{17}/cm^3$ to $10^{20}/cm^3$ and can have a thickness ranging from 10 nm to 1000 nm. The second doped region 1420 can be formed by ion implantation either from the top through the device and BOX layer or from the bottom with Si substrate layer thinned to 3 microns or less. For P type the dopant can be Boron, and from N type the dopant can be Phosphorous.

The switching region 1410 can be formed in the BOX layer by ion implantation of species such as Ti, Ta, Hf, Al, Mo, W, O, N, V, Be, Mg, Li, to name a few. The height "h" of switching region 1410 can span the depth of the BOX layer and in some cases can only partially span the depth of the BOX layer. In some cases, the switching layer 1410 can extend vertically into the second doped region 1420. In some case, the switching layer 1410 can extend vertically into the device layer (and first doped region 1510 shown in FIG. 15). The width "w" of the switching region can range from 2 nm-200 nm, and in some cases greater than 200 nm. The length "l" of the switching region (visible in FIGS. 17-18) can also range from 2 nm-200 nm, and in some cases greater than 200 nm. The switching region 1410 can be formed by ion implantation through the device layer, and in some cases can be formed by ion implantation through the substrate layer. The switching region height "h" can range from 2-25 nm. The concentration of the switching species can range from $10^{17}/cm^3$-$10^{22}/cm^3$. The switching region can be in contact with the second doped region 1420 which can be P or N. A thermal anneal can be performed to activate the doped region 1420 and to remove some damage to the crystalline device layer surface and/or the substrate. Both the doped regions and the switching region can be formed by selective area ion implantation where regions not ion implanted can be covered with a thick dielectric, and in some cases metal.

Figure 15:
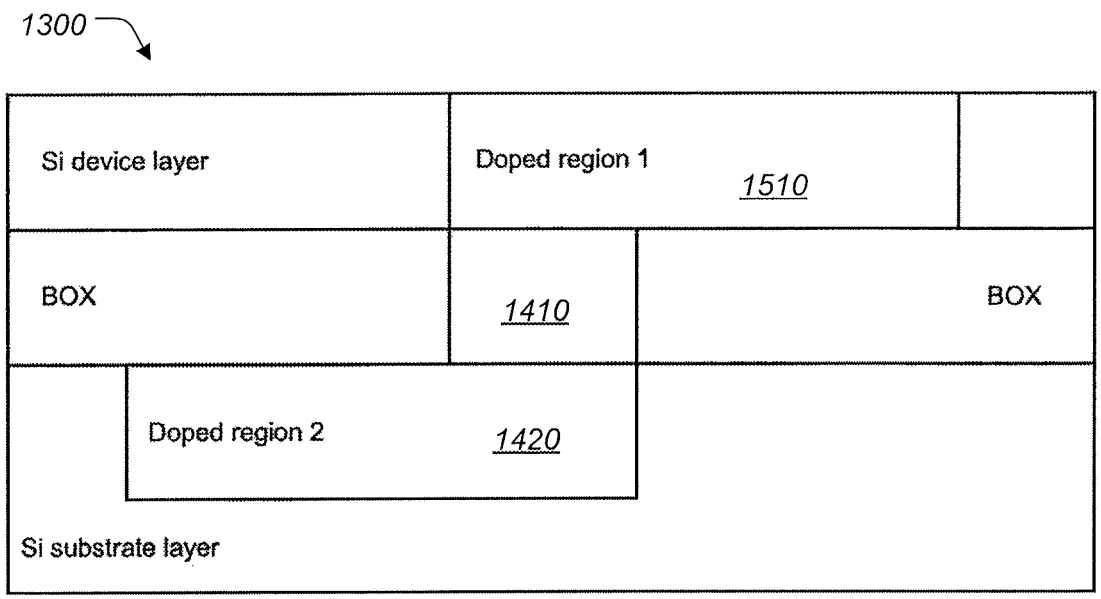
FIG. 15 shows a simple partial cross section schematic, according to some embodiments.

FIG. 15 shows a simplified partial cross section schematic, according to some embodiments. A first doped region 1510 is formed in the device layer which can be P or N with a doping concentration ranging from $10^{17}/cm^3$-$10^{20}/cm^3$. The first doped region 1510 can be formed with ion implantation. Doped region 1 can be formed in conjunction with CMOS transistor processing such as PMOS or NMOS.

Figure 16:
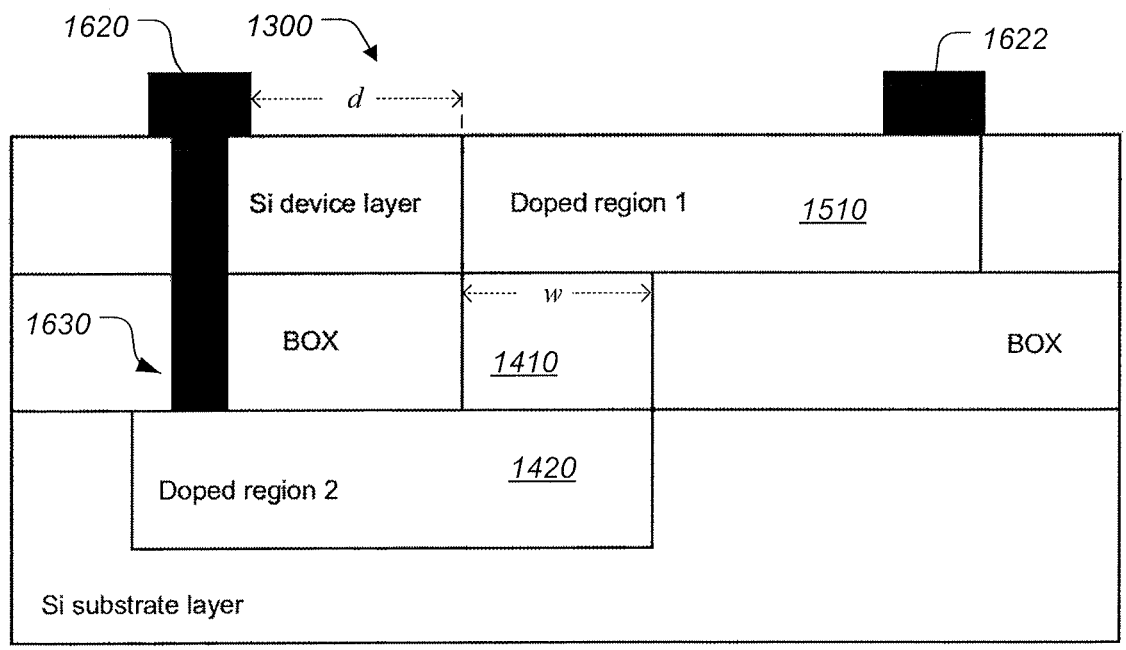
FIG. 16 shows a simple partial cross section, according to some embodiments.

FIG. 16 shows a simplified partial cross section, according to some embodiments. Electrode 1620 and contact 1630 are formed to make contact with the second doped region 1420 and Electrode 1622 is formed to make contact with the first doped region 1510. In the case of second doped region 1420 contact 1630 is formed in a trench through the device layer and though the BOX layer. According to some embodiments the trench can be insulated with a dielectric, and the metal contact 1630 can be formed with the second doped region 1420. Electrodes 1620 and 1622 can be connected to a cross bar architecture. Not visible in FIG. 16 are the connecting electrodes to the CMOS ASICs. Also not shown are passivation layers that may be formed on top of the memristor array. A bias can be applied between electrode 1620 and electrode 1622 to cause switching of the transition metal ions that are oxidized or reduced in forward or reverse polarity. In cases where the first doped region 1510 and second doped region 1420 have the same polarity or dopant such as P/switching region/P or N/switching region/N, the memristor can be bipolar and in cases where the first doped region 1510 and second doped region 1420 have opposite polarity such as N/switching region/P memristor can be unipolar such as in reference Li et. al. In some cases additional ion implantation and/or radiation can be used to generate defect channels in the switching region to facilitate the formation of filaments.

The electrodes 1620 and 1622 can be metal silicide and or metal and can be 50 nm or more from the switching region. The memristor element can have a dimension of 80 nm by 80 nm to 500 nm by 500 nm. In some cases, for 30 nm by 30 nm cell size and electrodes 10 nm away from switching region, array size of approximately 100 billion memristor cells can reside on one cm squared silicon. In some cases, approximately 1 trillion memristor cells can reside in one cm squared of silicon if each of the memristor elements is 10 nm×10 nm. The width of the switching region 1410 is "w". According to some embodiments, the distance "d" of the electrode 1620 from the edge of the switching region 1410 can be equal to w when w is 100 nm or less. Electrode and/or contact widths can range from 3 nm to 160 nm and in some cases from 6 m, to 45 nm.

Figure 17:
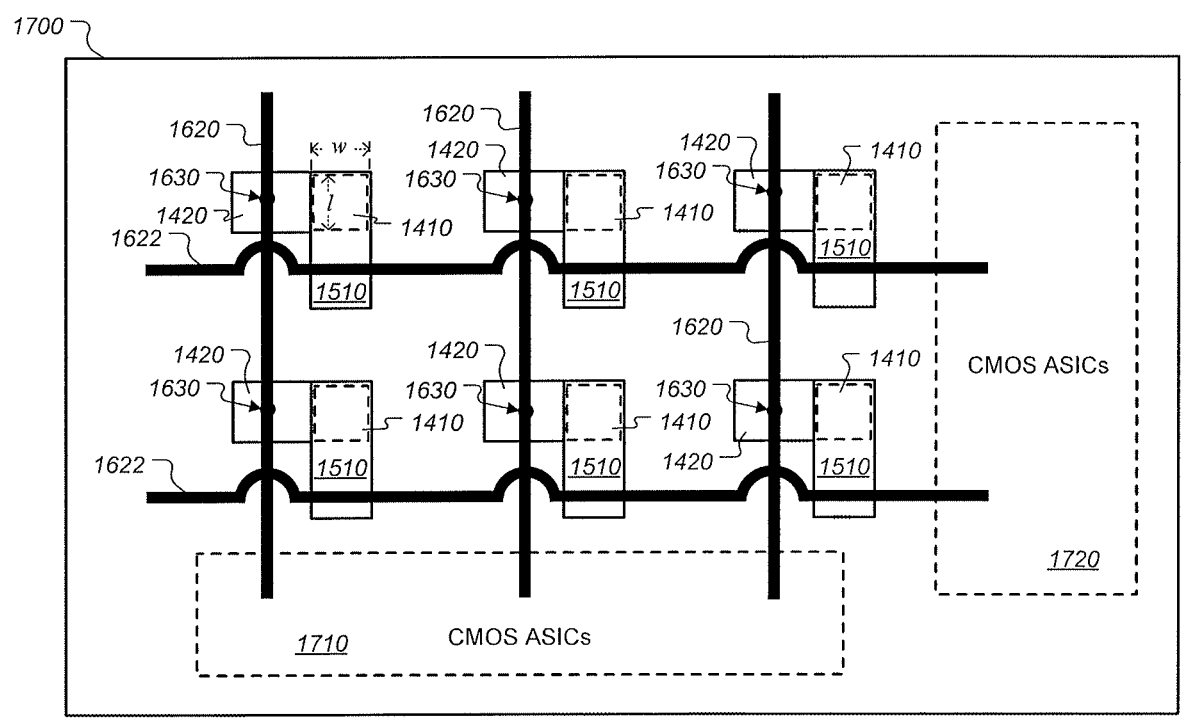
FIG. 17 shows a simple partial schematic of a top view of a monolithically integrated memristor array with CMOS ASICs chip, according to some embodiments.

FIG. 17 shows a simplified partial schematic of a top view of a monolithically integrated memristor array with CMOS ASICs (Application Specific Integrated Circuits) chip, according to some embodiments. The single chip 1700 includes a memristor array (simplified to show only 6 memristor elements) where CMOS electronics 1710 and 1720 are connected to the inputs and/or outputs (I/O) of the cross bars to store and read the state of each memristor for memory and/or for logic applications. Electrodes 1620 and 1622 are shown configured in a grid and are used to connect the Si first doped regions 1510 and second doped regions 1420. As can be seen, the metal electrodes 1620 and 1622 connecting each Si memristor are not in contact with the switching region 1410 and therefore can have a higher lifetime without metal migration from the electrodes to the switching regions 1410. The metal electrodes are only in contact with the doped regions. Ref. Kim2 et. al, A Functional Hybrid Crossbar-Array/CMOS Systems for Data Storage and Neuromorphic Applications, Nano Letters, Dec. 5, 2011 (incorporated herein by reference), discusses integration of memristors with CMOS electronics, however in that case the memristors are not made from Si. The memristor array can consist of all P/switching region/P or N/switching region/N or P/switching region/N or N/switching region/P, and/or any combination of the above.

Figure 18:
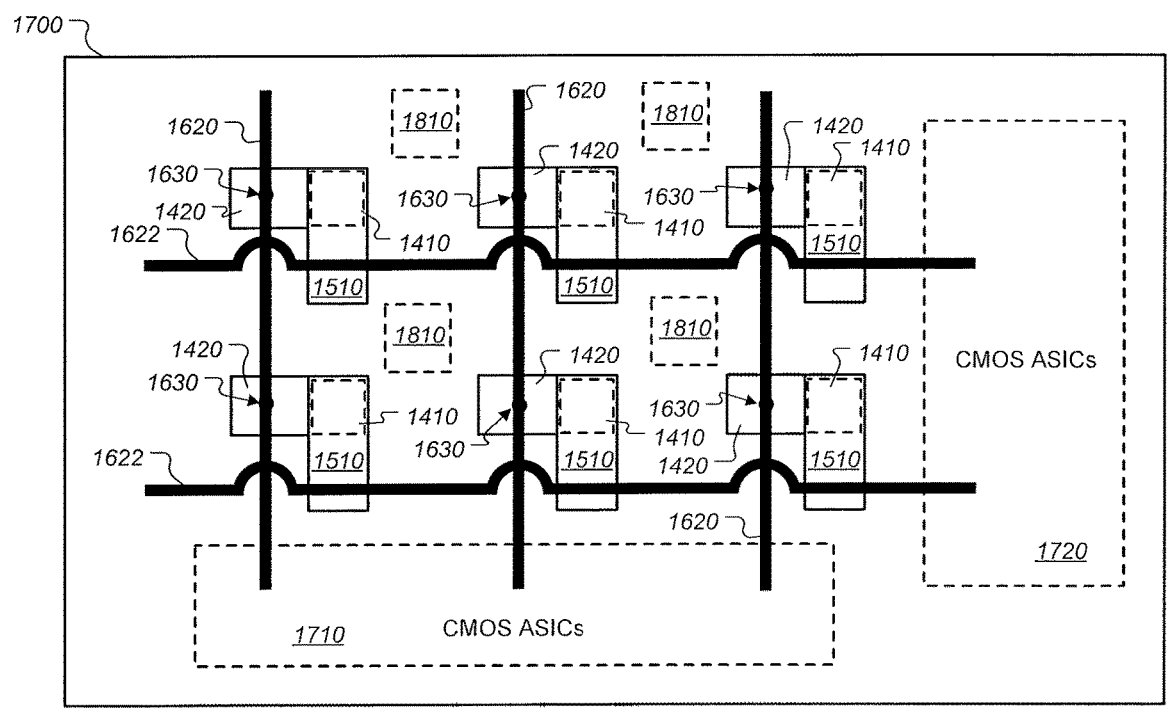
FIG. 18 shows a simple partial schematic top view similar to FIG. 17 with additional embedded CMOS ASICs, according to some embodiments.

Although a cross-bar type architecture is shown in FIGS. 17 and 18, according to some embodiments other architectures can be used for the memristor layout, including 3D (three-dimensional) architectures.

FIG. 18 shows a simple partial schematic top view similar to FIG. 17, according to some embodiments. In this case, a number of additional CMOS ASICs 1810 are embedded in the memristor array. The additional CMOS ASICs 1810 can further improve the performance due to the close proximity of CMOS ASICs to memristor elements or groups of memristor elements. Not shown are isolation trenches that can be etched around each or groups of memristor elements to reduce sneak current from the device and/or substrate layer.

CMOS ASICs (application specific integrated circuits) 1810 can be embedded in the memristor array to work as "block managers" in conjunction with the non-volatile memory/logic for applications where power can be turned off and the computer can retain all the information and can be turned back on instantly without rebooting. This can significantly reduce power consumption for data centers to smartphones to internet of things.

The ASICS such as ASICS 1710 and 1720 can be formed at the silicon device layer (the top Si layer) and/or at the silicon substrate layer (the Si substrate). Similarly, the additional ASICS 1810 can be formed at the top Si layer and/or at the Si substrate.

This patent application refers to certain theories in explaining the nature and operation of devices, but it should be clear that such theories are based on current understanding and do not affect the actual operation of the disclosed devices even if future developments prove the theories incorrect. This patent specification also refers to numerical ranges of parameters, and it should be understood that insubstantial departures from such ranges are still within the spirit of the disclosed advancements.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

What it claimed is:

1. A resistive random-access memory (RRAM) device comprising:
    an intermediate first layer that includes a switching region with added switching species of at least one different material;
    a device layer of a semiconductor material at one side of the intermediate layer and includes a first doped region, and a substrate layer of a semiconductor material at an opposite side of the first layer and comprises a second doped region;
    electrodes that are spaced from said switching region and contact said first and second doped regions; and
    wherein said switching region is configured to switch between higher and lower resistivity states in response to a switching voltage without having been conditioned with a higher, breakdown voltage.

2. The RRAM device of claim 1, further including one or more active electronic circuits formed in one or both of said device and substrate layers.

3. The RRAM device of claim 2, in which said one or more active electronic circuits are formed only at said device layer.

4. The RRAM device of claim 2, in which said one or more active electronic circuits are formed only at said substrate layer.

5. The RRAM device of claim 2, in which at least one of said electrodes has a contact that extends through said device layer and said intermediate layer to said second doped region but is spaced from said switching region.

6. The RRAM device of claim 2, in which said intermediate layer and said device and substrate layers comprise a single chip and said switching region and first and second doped regions are configured as plural, individually addressed resistive memory elements.

7. The RRAM device of claim 6, in which said resistive memory elements are characterized by a lifetime of 100 million or more switching cycles.

8. The RRAM device of claim 6, in which said resistive memory elements are characterized by differences of less than 10 percent in their respective switching voltages.

9. The RRAM device of claim 6, wherein said electrodes are configured to couple selected ones of said individually addressable resistive memory elements with respective ones of said one or more active electronic circuits.

10. The RRAM device of claim 6, in which said one or more active electronic circuits comprise at least one first circuit that is surrounded by said individually addressable resistive memory elements.

11. The RRAM device of claim 10, in which said one or more active electronic circuits further comprise at least one second circuit that is not surrounded by said individually addressable resistive memory devices.

12. A resistive random-access memory (RRAM) device comprising:
    a first layer comprising a switching region with added switching species of at least one different material;
    a device layer of Si with a first doped region at one side of the switching region, and a substrate layer of Si with a second doped region at an opposite side of the switching region; and
    electrodes that are spaced from said switching region and contact said first and second doped regions;
    wherein said switching region is configured to switch between higher and lower resistivity states in response to a switching voltage absent prior conditioning with a higher, breakdown voltage.

13. The RRAM device of claim 12, in which said first layer is a buried oxide layer (BOX) and said switching region comprises a portion thereof that has said added switching species of at least one different material.

14. The RRAM device of claim 12, in which said first and second doped regions are offset relative to each other but each has a portion coextensive with said switching region.

15. The RRAM device of claim 14, in which said electrodes contact portions of said doped regions that are not coextensive with said switching region.

16. The RRAM device of claim 12, in which said first layer and said device and substrate layers are formed as a single chip and said switching region and first and second doped regions are configured as plural, individually addressed resistive memory elements.

17. The RRAM device of claim 16, further including at least one active electronic circuit formed in or on said single chip and interacting with said memory elements.

18. The RRAM device of claim 17, in which said at least one active electronic circuit and said electrodes are at the same side of said switching region.

19. The RRAM device of claim 17, in which said at least one active electronic circuit and said electrodes are at opposite sides of said switching region.

20. The RRAM device of claim 17, in which said at least one active electronic circuit comprises at least one active electronic circuit that is surrounded by said memory elements.

* * * * *